United States Patent
Kyoung et al.

(10) Patent No.: US 10,812,037 B2
(45) Date of Patent: Oct. 20, 2020

(54) BULK-ACOUSTIC WAVE RESONATOR

(71) Applicant: Samsung Electro-Mechanics Co., Ltd., Suwon-si (KR)

(72) Inventors: Je Hong Kyoung, Suwon-si (KR); Tae Kyung Lee, Suwon-si (KR); Sung Sun Kim, Suwon-si (KR); Jin Suk Son, Suwon-si (KR); Ran Hee Shin, Suwon-si (KR); Hwa Sun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/417,857

(22) Filed: May 21, 2019

(65) Prior Publication Data

US 2020/0204145 A1  Jun. 25, 2020

(30) Foreign Application Priority Data

Dec. 19, 2018  (KR) .................. 10-2018-0164882

(51) Int. Cl.
*H03H 9/02* (2006.01)
*H03H 9/54* (2006.01)
*H03H 9/15* (2006.01)

(52) U.S. Cl.
CPC .......... *H03H 9/02007* (2013.01); *H03H 9/15* (2013.01); *H03H 9/54* (2013.01)

(58) Field of Classification Search
CPC ........ H03H 9/02; H03H 9/02007; H03H 9/15; H03H 9/54
USPC ...................................................... 333/186
See application file for complete search history.

(56) References Cited

U.S. PATENT DOCUMENTS

| | | | |
|---|---|---|---|
| 6,329,305 B1 | 12/2001 | Bower et al. | |
| 6,936,837 B2* | 8/2005 | Yamada | H03H 9/02094 257/2 |
| 7,230,511 B2* | 6/2007 | Onishi | H03H 3/02 333/187 |
| 7,482,737 B2* | 1/2009 | Yamada | H03H 3/02 310/363 |
| 7,554,426 B2* | 6/2009 | Lee | H03H 3/02 310/364 |
| 9,679,765 B2* | 6/2017 | Larson, III | C23C 14/025 |
| 2008/0061907 A1 | 3/2008 | Lee et al. | |

(Continued)

FOREIGN PATENT DOCUMENTS

| | | |
|---|---|---|
| JP | 5-183378 A | 7/1993 |
| JP | 2003-152498 A | 5/2003 |

(Continued)

OTHER PUBLICATIONS

R. Nussl et al., Enhanced stree durability of nano resonators with scandium doped electrodes, 2010, Science Direct, 7 pages.*

(Continued)

*Primary Examiner* — Dean O Takaoka
(74) *Attorney, Agent, or Firm* — NSIP Law

(57) ABSTRACT

A bulk acoustic wave resonator includes: a substrate; a first electrode disposed on the substrate; a piezoelectric layer at least partially disposed on the first electrode; and a second electrode disposed on the piezoelectric layer; wherein the first electrode includes an aluminum alloy layer containing scandium (Sc), and has a surface roughness of 2.4 nm or less, based on an arithmetic mean roughness.

11 Claims, 15 Drawing Sheets

(56) References Cited

U.S. PATENT DOCUMENTS

| | | | |
|---|---|---|---|
| 2014/0246305 A1* | 9/2014 | Larson, III | H03H 9/173 204/192.18 |
| 2016/0301380 A1 | 10/2016 | Lee et al. | |
| 2018/0041189 A1 | 2/2018 | Lee et al. | |
| 2018/0062608 A1 | 3/2018 | Lee et al. | |

FOREIGN PATENT DOCUMENTS

| | | |
|---|---|---|
| JP | 5299676 B2 | 9/2013 |
| KR | 10-0802109 B1 | 2/2008 |
| KR | 10-0859674 B1 | 9/2008 |
| KR | 10-2016-0121351 A | 10/2016 |
| KR | 10-2018-0015338 A | 2/2018 |
| KR | 10-2018-0023787 A | 3/2018 |

OTHER PUBLICATIONS

Korean Office Action dated Feb. 13, 2020 in the related Korean Patent Aplication No. 10-2018-0164882 (7 pages in English, 6 pages in Korean).

* cited by examiner

AlSc #1

BULK-ACOUSTIC WAVE RESONATOR

CROSS-REFERENCE TO RELATED APPLICATIONS

This application claims the benefit under 35 U.S.C. § 119(a) of Korean Patent Application No. 10-2018-0164882 filed on Dec. 19, 2018 in the Korean Intellectual Property Office, the entire disclosure of which is incorporated herein by reference for all purposes.

BACKGROUND

1. Field

The following description relates to a bulk acoustic wave resonator.

2. Description of Related Art

Interest in 5G communications technology has been increasing, and technological developments have been undertaken in candidate bands.

On the other hand, a frequency band that may be implemented with a film bulk acoustic wave resonator (FBAR), is a frequency band of about 6 GHz or less. In the case of FBARs operating in frequency bands of 2 to 3 GHz, an electrode thickness and a piezoelectric layer thickness may be easily implemented. However, in the case of FBARs operating in a 5 GHz frequency band, significant manufacturing process difficulty and performance degradation are anticipated.

In detail, in the case of a FBAR operating in the 5 GHz frequency band, an ultrathin film electrode should be able to be implemented, and a piezoelectric layer thickness should also be relatively thin. However, in a case in which an electrode material having relatively high acoustic impedance, such as molybdenum (Mo), is used, an increase in electrical loss due to reduction in thickness is anticipated, and electrical loss of the resonator and a filter device including the resonator is expected to increase.

However, in a case in which an electrode material having low acoustic impedance properties, such as aluminum (Al), is used, mechanical properties of aluminum (Al) are degraded and, thus, are predicted to have great mechanical dynamic loss, and crystal orientation is deteriorated at the time of forming a piezoelectric layer.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes: a substrate; a first electrode disposed on the substrate; a piezoelectric layer at least partially disposed on the first electrode; and a second electrode disposed on the piezoelectric layer; wherein the first electrode includes an aluminum alloy layer containing scandium (Sc), and has a surface roughness of 2.4 nm or less, based on an arithmetic mean roughness.

A content of the scandium (Sc) in the aluminum alloy layer may be 0.1 at % to 5 at %.

A doping material of the piezoelectric layer may include any one or any combination of any two or more of scandium, erbium, yttrium, lanthanum, titanium, zirconium, and hafnium.

A content of the doping material in the piezoelectric layer may be 0.1 at % to 30 at %.

A full width at half maximum (FWHM), representing crystallinity, of the piezoelectric layer may be 1 degree or less.

The bulk acoustic wave resonator may further include a passivation layer disposed to cover either one or both of the first electrode and the second electrode.

The second electrode may include an aluminum alloy layer containing scandium (Sc).

The second electrode may be composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or may include a layer composed of an alloy including any one of Mo, Ru, W, Ir, Pt, Cu, Ti, Ta, Ni, and Cr.

The first electrode may include a first electrode layer composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or composed of an alloy including any one of Mo, Ru, W, Ir, Pt, Cu, Ti, Ta, Ni, and Cr, and a second electrode layer disposed on the first electrode layer and including an aluminum alloy containing scandium (Sc).

The first electrode may include a first electrode layer including an aluminum alloy containing scandium (Sc), and a second electrode layer disposed on the first electrode layer, the second electrode layer being composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or being composed of an alloy including any one of Mo, Ru, W, Ir, Pt, Cu, Ti, Ta, Ni, and Cr.

The second electrode may include a first electrode layer composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or composed of an alloy including any one of Mo, Ru, W, Ir, Pt, Cu, Ti, Ta, Ni, and Cr, and a second electrode layer disposed on the first electrode layer and including an aluminum alloy containing scandium (Sc).

The second electrode may include a third electrode layer composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or composed of an alloy including any one of Mo, Ru, W, Ir, Pt, Cu, Ti, Ta, Ni, and Cr, and a fourth electrode layer disposed on the third electrode layer and including an aluminum alloy containing scandium (Sc).

The second electrode may include a third electrode layer composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or composed of an alloy including any one of Mo, Ru, W, Ir, Pt, Cu, Ti, Ta, Ni, and Cr, and a fourth electrode layer disposed on the third electrode layer and including an aluminum alloy containing scandium (Sc).

The second electrode may include a first electrode layer including an aluminum alloy containing scandium (Sc), and a second electrode layer disposed on the first electrode layer, the second electrode layer being composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or being composed of an alloy including one of Mo, Ru, W, Ir, Pt, Cu, Ti, Ta, Ni, or Cr.

The second electrode may include a third electrode layer including an aluminum alloy containing scandium (Sc), and a fourth electrode layer disposed on the third electrode layer, the fourth electrode layer being composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or being composed of an alloy including any one of Mo, Ru, W, Ir, Pt, Cu, Ti, Ta, Ni, and Cr.

The second electrode may include a third electrode layer including an aluminum alloy containing scandium (Sc), and a fourth electrode layer disposed on the third electrode layer, the fourth electrode layer being composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or being composed of an alloy including any one of Mo, Ru, W, Ir, Pt, Cu, Ti, Ta, Ni, and Cr.

The first electrode may include a first electrode layer composed of any one of molybdenum (Mo), ruthenium (Ru), tungsten (W), iridium (Ir), platinum (Pt), copper (Cu), titanium (Ti), tantalum (Ta), nickel (Ni) and chromium (Cr), or composed of an alloy including any one of Mo, Ru, W, Ir, Pt, Cu, Ti, Ta, Ni, and Cr, and a second electrode layer disposed on the first electrode layer and including an aluminum alloy containing scandium (Sc).

The first electrode may include a first electrode layer including an aluminum alloy containing scandium (Sc), and a second electrode layer disposed on the first electrode layer, the second electrode layer being composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or being composed of an alloy including any one of Mo, Ru, W, Ir, Pt, Cu, Ti, Ta, Ni, and Cr.

In another general aspect, a bulk acoustic wave resonator includes: a substrate; a first electrode disposed on the substrate, and including an aluminum alloy layer containing scandium (Sc); a piezoelectric layer at least partially disposed on the first electrode; and a second electrode disposed on the piezoelectric layer, wherein a full width at half maximum (FWHM), representing crystallinity, of the piezoelectric layer is 1 degree or less.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
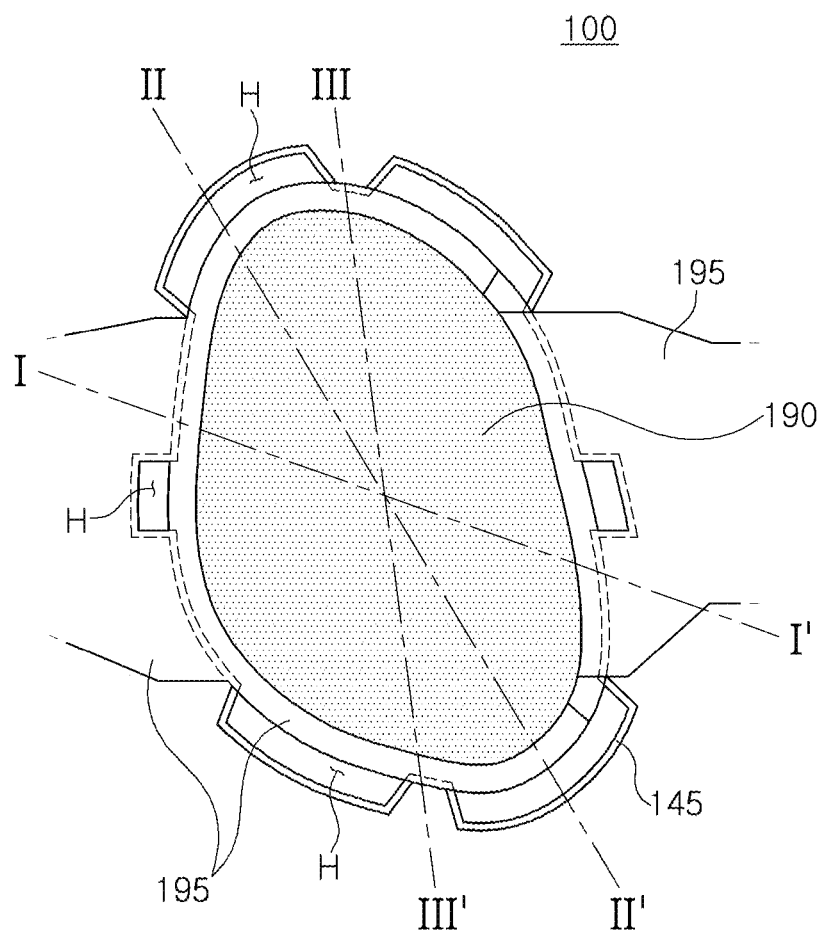
FIG. 1 is a schematic plan view illustrating a bulk acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
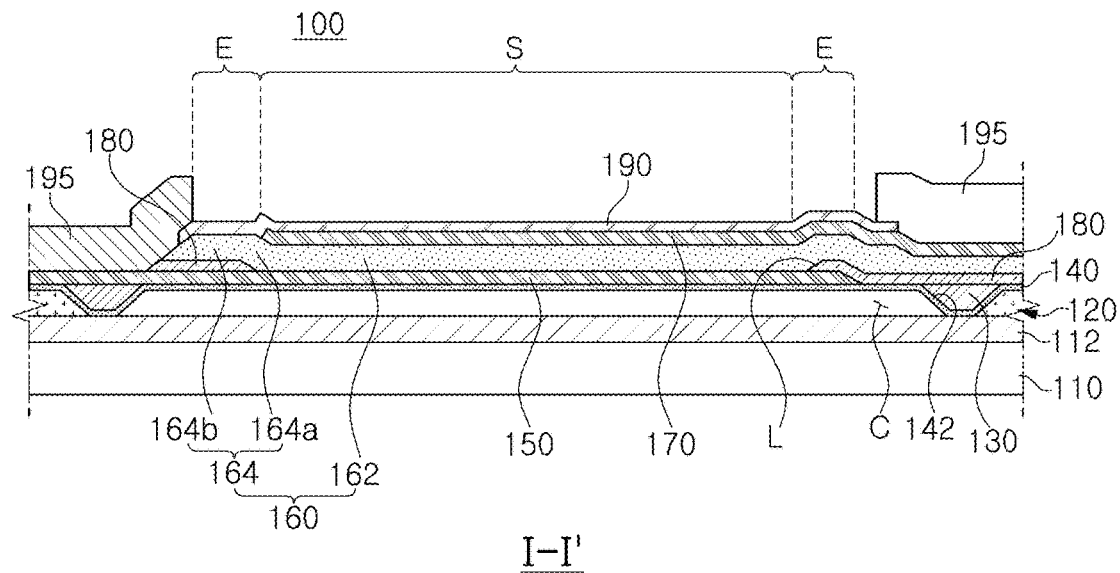
FIG. 2 is a cross-sectional view taken along line I-I' in FIG. 1.
Figure 3:
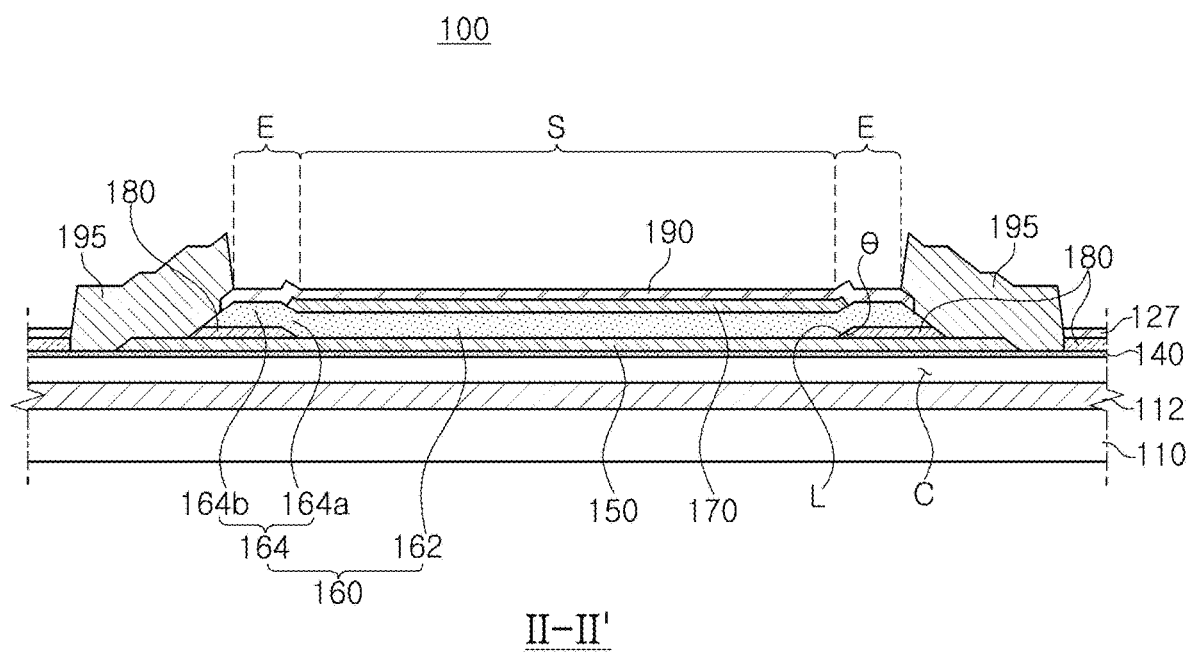
FIG. 3 is a cross-sectional view taken along line II-II" of FIG. 1.
Figure 4:
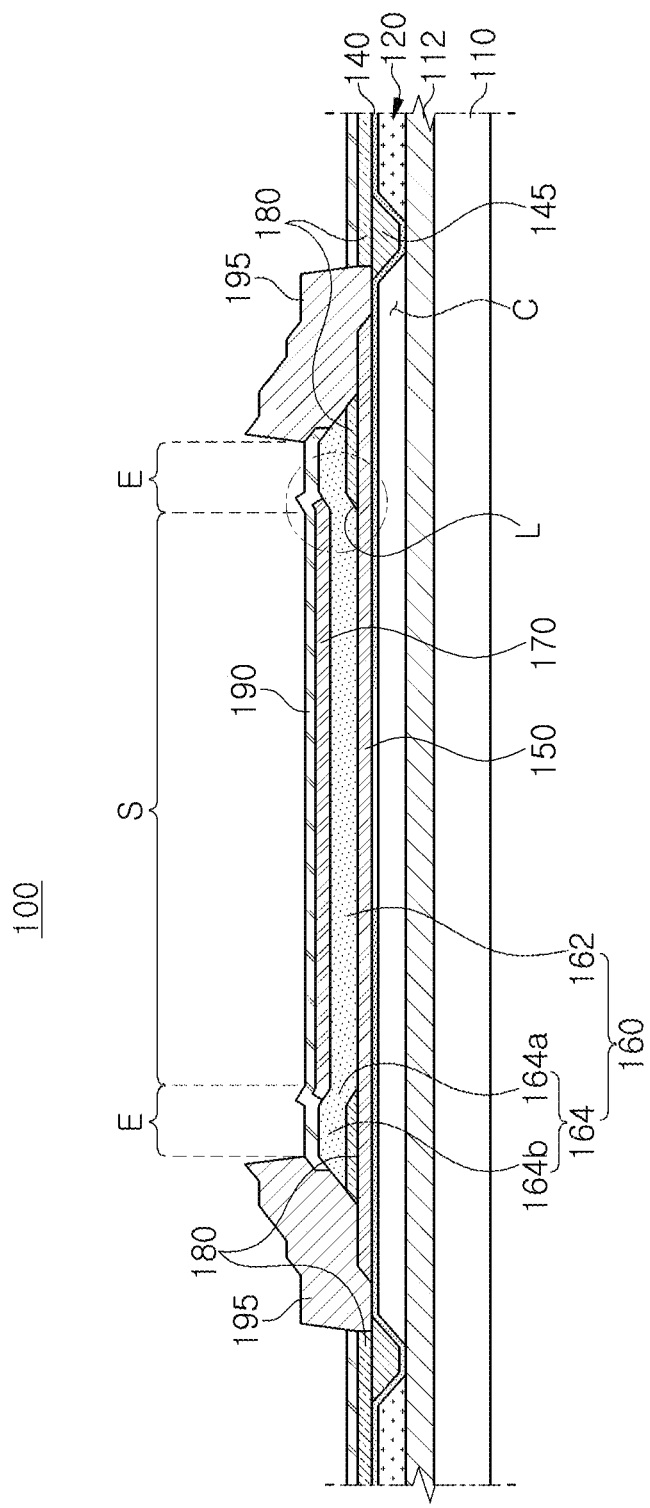
FIG. 4 is a cross-sectional view taken along line III-III' of FIG. 1.

FIG. 1 is a schematic plan view illustrating a bulk acoustic wave resonator 100, according to an embodiment. FIG. 2 is a cross-sectional view taken along line I-I' in FIG. 1. FIG. 3 is a cross-sectional view taken along line II-II' in FIG. 1. FIG. 4 is a cross-sectional view taken along line III-III' in FIG. 1.

Referring to FIGS. 1 to 4, the bulk acoustic wave resonator 100 may include a substrate 110, a sacrificial layer 120, an etch stop portion 130, a membrane layer 140, a first electrode 150, a piezoelectric layer 160, a second electrode 170, an insertion layer 180, a passivation layer 190, and a metal pad 195.

The substrate 110 may be a silicon substrate. For example, a silicon wafer may be used as the substrate 110. Alternatively, a silicon on insulator (SOI)-type substrate may be used.

An insulating layer 112 may be formed on an upper surface of the substrate 110, and may electrically isolate the substrate 110 from layers, components, and/or elements disposed on an upper portion thereof. In addition, the insulating layer 112 prevents the substrate 110 from being etched by etching gas in a case in which a cavity C is formed during a manufacturing process.

The insulating layer 112 may be formed of any one or any combination of any two or more of silicon dioxide ($SiO_2$), silicon nitride ($Si_3N_4$), aluminum oxide ($Al_2O_3$), and aluminum nitride (AlN), and may be formed using chemical vapor deposition, RF magnetron sputtering, or evaporation.

The sacrificial layer 120 is formed on the insulating layer 112, and the cavity C and the etch stop portion 130 may be disposed inside the sacrificial layer 120. The cavity C is formed by removing a portion of the sacrificial layer 120. As such, as the cavity C is formed inside the sacrificial layer 120, the first electrode 150 and the like disposed on the sacrificial layer 120 may be formed to be flat.

The etch stop portion 130 is disposed along a boundary of the cavity C. The etch stop portion 130 prevents etching from progressing beyond a cavity area in the process of forming the cavity C.

The membrane layer 140 forms the cavity C together with the substrate 110. In addition, the membrane layer 140 may be formed of a material having a low reactivity with the etching gas when the sacrificial layer 120 is removed. The etch stop portion 130 is inserted into a groove 142 formed by the membrane layer 140. A dielectric layer including a material including any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the membrane layer 140.

A seed layer (not illustrated) formed of aluminum nitride (AlN) may be formed on the membrane layer 140. For example, the seed layer may be disposed between the membrane layer 140 and the first electrode 150. The seed layer may be formed using a dielectric or metal having a hexagonal close packing (HCP) crystal structure in addition to aluminum nitride (AlN). For example, when the seed layer is a metal layer, the seed layer may be formed of titanium (Ti).

The first electrode 150 is formed on the membrane layer 140, and a portion of the first electrode 150 is disposed on an upper portion of the cavity C. The first electrode 150 may be used as either an input electrode or an output electrode for inputting and outputting an electrical signal such as a radio frequency (RF) signal or the like.

The first electrode 150 may be formed of an aluminum alloy containing scandium (Sc), as an example. As described above, since the first electrode 150 is formed of an aluminum alloy containing scandium (Sc), mechanical strength of first electrode 150 may be increased and high power reactive sputtering may be performed. Surface roughness of the first electrode 150 may be prevented from increasing and high orientation growth of the piezoelectric layer 160 may be induced under such deposition conditions.

In addition, since the first electrode 150 contains scandium (Sc), chemical resistance of the first electrode 150 is increased, and a disadvantage that occurs in a case in which the first electrode is formed of pure aluminum may be mitigated. Further, stability of a process, such as dry etching or wet processing, may be provided in manufacturing. Further, in a case in which the first electrode is formed of pure aluminum, oxidation is easily caused. However, since the first electrode 150 is formed of an aluminum alloy containing scandium, chemical resistance to oxidation may be improved.

In an example, first, an electrode was formed of a molybdenum (Mo) material and an aluminum alloy (AlSc) material containing scandium to have a thickness of 1500 Å, and sheet resistance thereof was measured. In this example, when the electrode was formed of a molybdenum (Mo) material, the sheet resistance was 0.9685, while when the electrode was formed of an aluminum alloy (AlSc) containing 0.625 at % of scandium, the sheet resistance was 0.316. As described above, it can be appreciated that when the electrode was formed of an aluminum alloy (AlSc), the sheet resistance was reduced as compared with the case in which the electrode was formed of the molybdenum (Mo) material.

On the other hand, the content of scandium (Sc) may be 0.1 at % to 5 at %. For example, if the content of scandium (Sc) is less than 0.1 at %, mechanical property deterioration and hillock may be caused by aluminum (Al), and if the content of scandium (Sc) is 5 at % or more, it may be difficult to reduce electrical loss indicating sheet resistance. In addition, if the content of scandium (Sc) increases, the surface roughness may increase, which may adversely affect crystal orientation.

TABLE 1

| Material | Yield Strength | Elongation |
| --- | --- | --- |
| Pure Al | 35 Mpa | 45% |
| AlSc(Sc 0.625 at %) | 300 Mpa | 15% |

Figure 5:
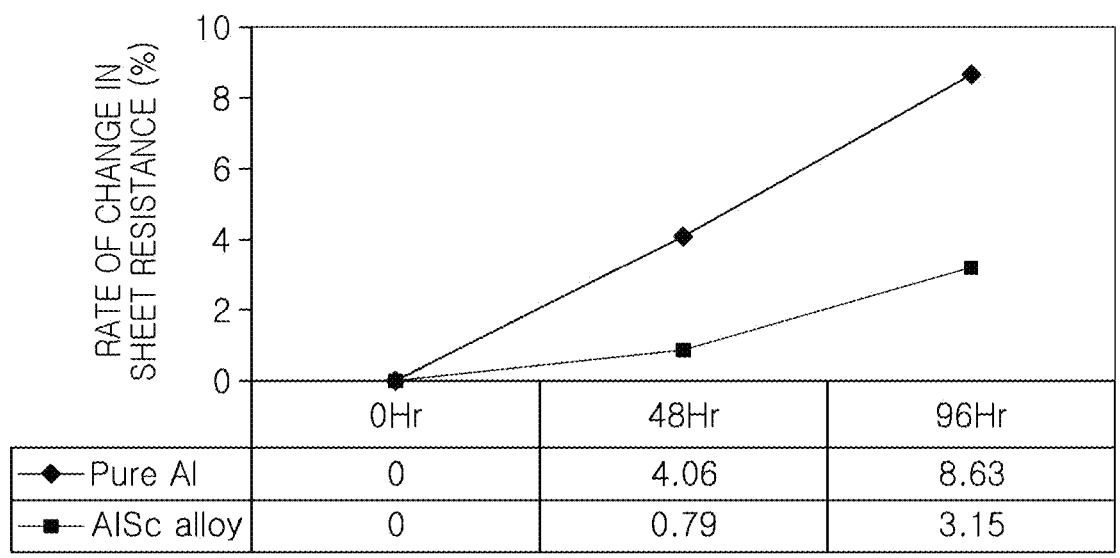
FIG. 5 is a graph illustrating a rate of sheet resistance change of an aluminum alloy including pure aluminum and scandium.

As illustrated above in Table 1, yield strength is increased and elongation is decreased in the case of the aluminum alloy containing scandium (AlSc, 0.625 at %), as compared with the case of pure aluminum (Al). In addition, as illustrated in FIG. 5, the pure aluminum (Al) material and the aluminum alloy (AlSc, 0.625 at %) containing scandium were deposited to have a thickness of 1500 Å to measure a sheet resistance change in a reliable environment. As a result, it can be appreciated that a rate of change of sheet resistance after 96 Hr is about 50% in the case of the aluminum alloy (AlSc, 0.625 at %) containing scandium, as compared with that in the pure aluminum (Al), thereby exhibiting excellent oxidation resistance.

Also, since the first electrode 150 has excellent galvanic corrosion resistance with the metal pad 195, stability in a manufacturing process may be obtained. For example, a material of pure aluminum (Al) and an aluminum alloy containing scandium (AlSc, 0.625 at %) were deposited to have a thickness of 1500 Å and then contacted with gold (Au), which is mainly used as a material of the metal pad 195, and the deposited material of pure aluminum (Al) and aluminum alloy containing scandium (AlSc, 0.625 at %) were then immersed in an electrolyte solution for 65 hours, to compare galvanic corrosion characteristics. As a comparison result, no change in a surface was observed for the aluminum alloy containing scandium (AlSc, 0.625 at %), but corrosion with gold (Au) was observed in the pure aluminum material. Therefore, when the first electrode 150 is formed of an aluminum alloy (AlSc) containing scandium, excellent galvanic corrosion resistance properties may also be provided.

Furthermore, the first electrode 150 may be formed of an aluminum alloy (AlSc) only containing scandium (Sc). For example, no additional metal except aluminum (Al) and scandium (Sc) is contained in the first electrode 150. If additional metals other than scandium (Sc) are present with aluminum (Al), such an aluminum alloy forms a ternary phase diagram. In such a case, it is difficult to control a composition, and a complex phase system is generated, thereby causing the occurrence of compositional unevenness and undesired crystal phase.

Further, when the first electrode 150 is formed of an aluminum alloy having a ternary system, the surface roughness is increased due to uneven composition and undesired crystal phase formation, which may adversely affect crystal orientation when the piezoelectric layer 160 is formed.

Thus, since the first electrode 150 is formed of an aluminum alloy (AlSc) containing only scandium (Sc), the crystal orientation of the piezoelectric layer 160 disposed on the first electrode 150 may be improved.

On the other hand, the surface roughness of the first electrode 150 may be 2.4 nm or less, based on the arithmetic mean roughness Ra. In this case, the arithmetic mean roughness Ra is defined by the following equation.

$$R_a = \frac{1}{n}\sum_{i=1}^{n}|y_i|$$

Figure 6:
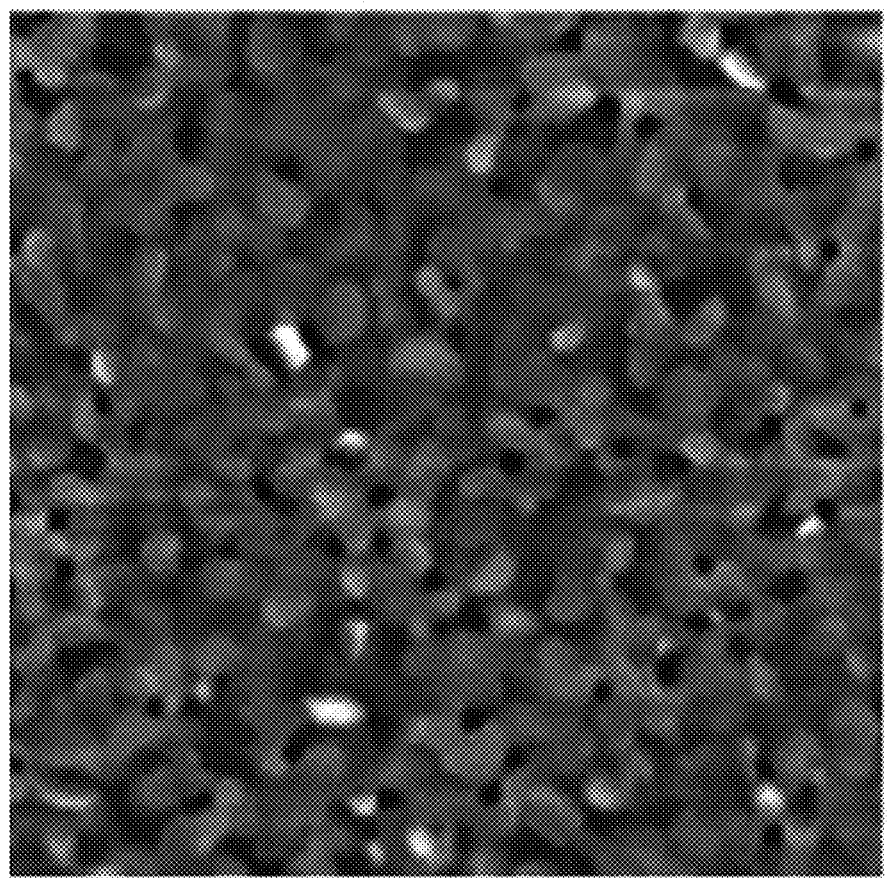
FIG. 6 is an image illustrating a case in which surface roughness of pure aluminum imaged by an atomic force microscope is 3.64 based on the arithmetic mean roughness Ra.
Figure 7:
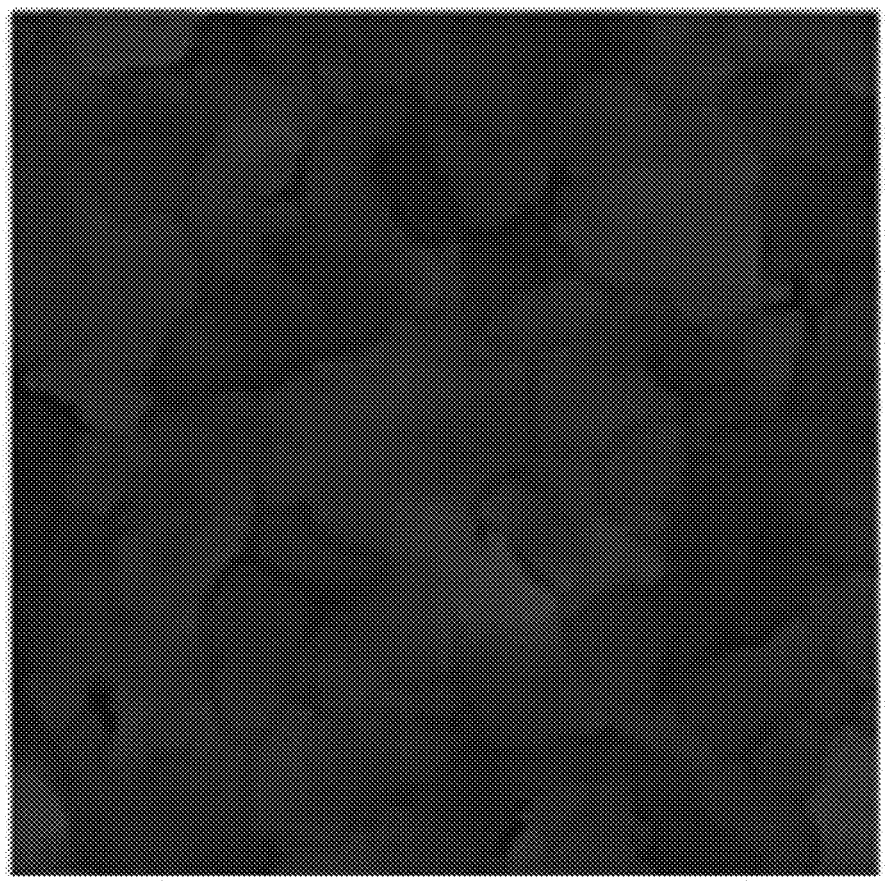
FIG. 7 is an image illustrating a case in which surface roughness of a scandium-containing aluminum alloy imaged by an atomic force microscope is 1.90, based on an arithmetic mean roughness Ra.
Figure 8:
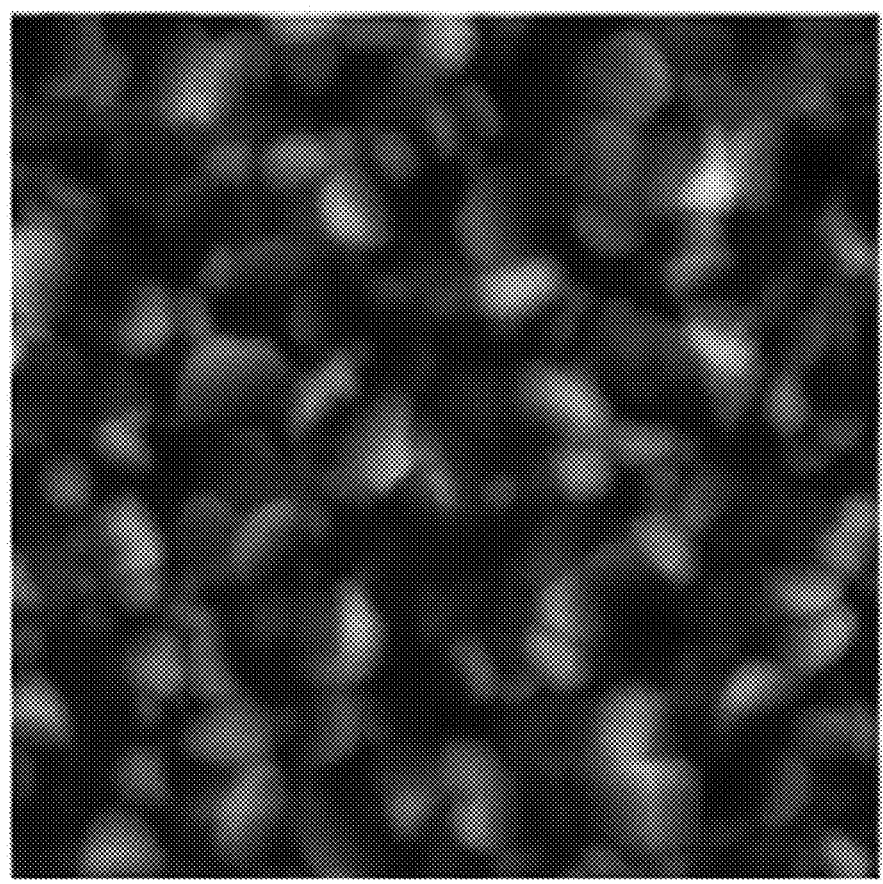
FIG. 8 is an image illustrating a case in which surface roughness of a scandium-containing aluminum alloy imaged by an atomic force microscope is 10.68 based on the arithmetic mean roughness Ra.

As an example, FIGS. 6 to 8 illustrate a case in which a surface roughness of pure aluminum imaged by an atomic force microscope is 3.64 nm based on the arithmetic mean roughness Ra, a case in which a surface roughness of a scandium-containing aluminum alloy imaged by an atomic force microscope is 1.90 nm based on the arithmetic mean roughness Ra, and a case in which a surface roughness of the scandium-containing aluminum alloy by the atomic force microscope is 10.68 nm based on the arithmetic mean roughness Ra.

Figure 9:
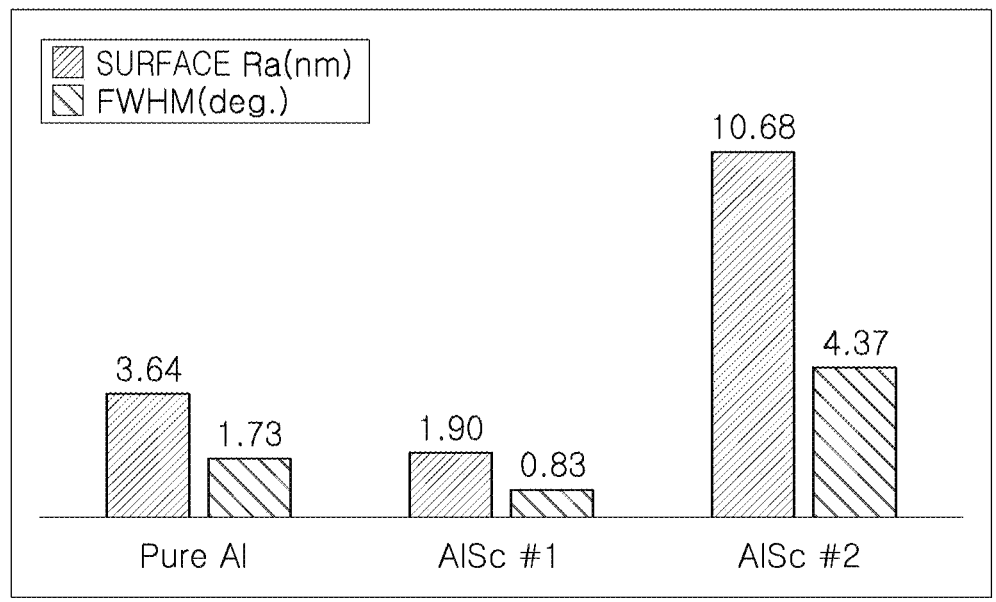
FIG. 9 is a graph illustrating a full width at half maximum (FWHM) representing crystallinity of a piezoelectric layer, depending on surface roughness of pure aluminum and a scandium-containing aluminum alloy.

In this case, as illustrated in FIG. 9, it can be seen that crystallinity of the piezoelectric layer 160 deteriorates when the surface roughness of the aluminum alloy (AlSc) containing scandium (Sc) deteriorates.

For example, it can be seen that: when the surface roughness of pure aluminum is 3.64 nm based on the arithmetic mean roughness Ra, a full width at half maximum (FWHM) representing the crystallinity of the piezoelectric layer 160 is 1.73 deg.; when the surface roughness of the scandium-containing aluminum alloy is 1.90 nm based on the arithmetic mean roughness Ra, FWHM representing the crystallinity of the piezoelectric layer 160 is 0.83 deg.; and when the surface roughness of the scandium-containing aluminum alloy is 10.68 nm based on the arithmetic mean roughness Ra, FWHM representing the crystallinity of the piezoelectric layer 160 is 4.37 deg.

In other words, it can be appreciated that even when the first electrode is formed of an aluminum alloy (AlSc) containing only scandium (Sc), if the surface roughness of the first electrode is poor, the piezoelectric layer 160 is deteriorated in crystallinity, even compared with the case in which the first electrode is formed of pure aluminum.

Figure 10:
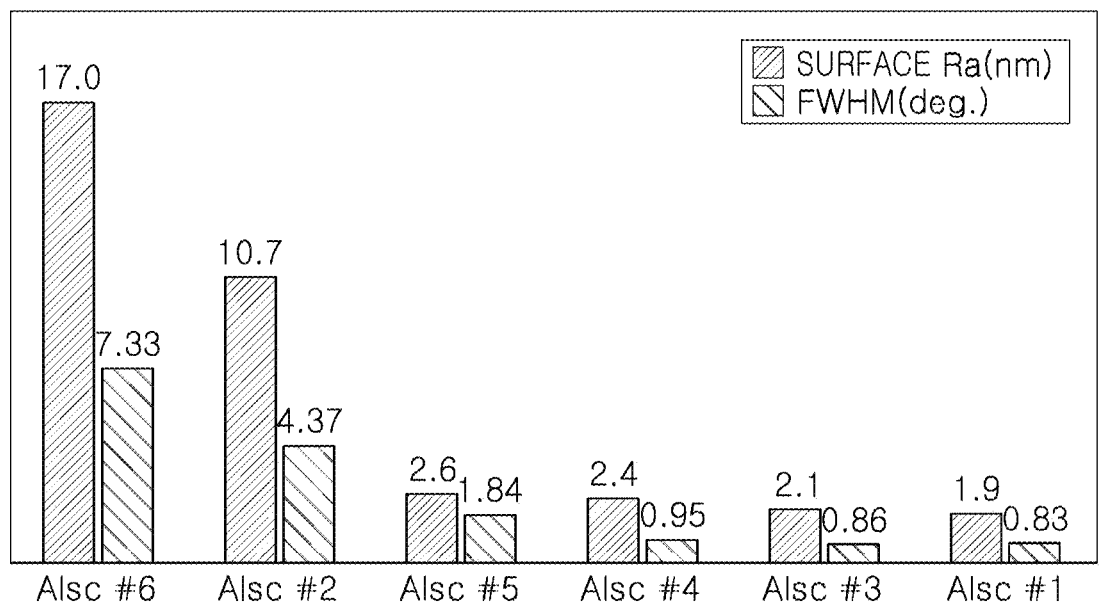
FIG. 10 is a graph illustrating a full width at half maximum (FWHM) representing crystallinity of a piezoelectric layer, depending on surface roughness of a scandium-containing aluminum alloy.

On the other hand, as illustrated in FIG. 10, it can be seen that when the surface roughness of the scandium-containing aluminum alloy is greater than 2.4 nm on the basis of the arithmetic mean roughness Ra, the FWHM indicating the crystallinity of the piezoelectric layer 160 increases sharply.

For example, when the surface roughness of the scandium-containing aluminum alloy is 1.9 nm based on the arithmetic mean roughness Ra, as in a first test piece (#1) of FIGS. 9 and 10, FWHM indicating the crystallinity of the piezoelectric layer 160 is 0.83 deg. When the surface roughness of the scandium-containing aluminum alloy is 2.1 nm based on the arithmetic mean roughness Ra, as in a third test piece (#3) of FIG. 10, the FWHM indicating the crystallinity of the piezoelectric layer 160 is 0.86 deg. When the surface roughness of the scandium-containing aluminum alloy is 2.4 nm based on the arithmetic mean roughness Ra, as in a fourth test piece (#4), the FWHM indicating the crystallinity of the piezoelectric layer 160 is 0.95 deg.

For example, when a difference between arithmetic mean roughnesses Ra of the first test piece #1 and the third test piece #3 is 0.2 nm, a difference in FWHM indicating the crystallinity of the piezoelectric layer 160 is 0.03 deg. When the difference between the arithmetic mean roughnesses Ra of the third test piece #3 and the fourth test piece #4 is 0.3 nm, the difference in FWHM indicating the crystallinity of the piezoelectric layer 160 is 0.09 deg. In other words, when the surface roughness of the scandium-containing aluminum alloy is 2.4 nm or less, based on the arithmetic mean roughness Ra, it can be seen that an increase in FWHM indicating the crystallinity of the piezoelectric layer 160 is relatively low.

On the other hand, when the surface roughness of the scandium-containing aluminum alloy as in a fifth test piece (#5) is 2.6 nm based on the arithmetic mean roughness Ra, the FWHM indicating the crystallinity of the piezoelectric layer 160 is 1.84 deg.

Surface roughnesses of the scandium-containing aluminum alloys of the fourth test piece (#4) and the fifth test piece (#5) have a difference of 0.2 nm, based on the arithmetic mean roughness Ra. In this case, it can be seen that the difference in FWHM representing the crystallinity of the piezoelectric layer 160 is approximately twofold (0.89 deg.). Thus, when the surface roughness of the scandium-containing aluminum alloy exceeds 2.4 nm based on the arithmetic mean roughness Ra, the crystallinity of the piezoelectric layer 160 drastically deteriorates. In detail, when the surface roughness of the scandium-containing aluminum alloy exceeds 2.4 nm based on the arithmetic mean roughness Ra, the FWHM indicating the crystallinity of the piezoelectric layer 160 increases sharply.

Further, as illustrated in FIGS. 9 and 10, in the case of a second test piece (#2), a surface roughness of the scandium-containing aluminum alloy is 10.7 nm based on the arithmetic mean roughness Ra, and the FWHM indicating the crystallinity of the piezoelectric layer 160 is 4.37 deg. As illustrated in FIG. 10, in the case of a sixth test piece (#6), a surface roughness of the scandium-containing aluminum alloy is 17.0 nm based on the arithmetic mean roughness Ra, and in this case, the FWHM indicating the crystallinity of the piezoelectric layer 160 is 7.33 deg.

As described above, in the case in which the surface roughness of the first electrode exceeds 2.4 nm based on the arithmetic mean roughness Ra, the FWHM indicating the crystallinity of the piezoelectric layer 160 sharply increases. Thus, the surface roughness of the first electrode 150 is set to 2.4 nm or less, based on the arithmetic mean roughness Ra.

The piezoelectric layer 160 is formed to cover at least a portion of the first electrode 150 disposed on an upper portion of the cavity C. The piezoelectric layer 160 is formed of any one of aluminum nitride (AlN), zinc oxide (ZnO), and lead zirconium titanium oxide (PZT:PbZrTiO), and is a part causing a piezoelectric effect to convert electrical energy into mechanical energy in the form of acoustic waves. In detail, for example, when the piezoelectric layer 160 is formed of aluminum nitride (AlN), the piezoelectric layer 150 may further include a rare earth metal. As an example, the rare earth metal may include any one or any combination of any two or more of scandium (Sc), erbium (Er), yttrium (Y), and lanthanum (La). Also, as an example, a transition metal may include any one or any combination of any two or more of titanium (Ti), zirconium (Zr), hafnium (Hf), tantalum (Ta), and niobium (Nb), and may also include magnesium (Mg), which is a divalent metal.

The content of elements included in the aluminum nitride (AlN) to improve piezoelectric properties may be 0.1 to 30 at %. If the content of the elements included to improve piezoelectric properties is less than 0.1 at %, piezoelectric properties higher than that of aluminum nitride (AlN) may not be implemented. If the content of the elements included to improve piezoelectric properties exceeds 30 at %, it may be difficult to perform deposition and control a composition for deposition, and a nonuniform phase may be formed. In addition, if the element content exceeds 30 at %, the probability of occurrence of abnormal grain growth sharply increases, so that serious surface defects may occur on the piezoelectric layer.

The piezoelectric layer 160 includes a piezoelectric portion 162 disposed on a flat portion S of the bulk acoustic wave resonator 100 and a bent portion 164 disposed on an extended portion E of the bulk acoustic wave resonator 100.

The piezoelectric portion 162 is a portion directly stacked on an upper surface of the first electrode 150. Therefore, the piezoelectric portion 162 is interposed between the first electrode 150 and the second electrode 170, and is formed as a flat shape together with the first electrode 150 and the second electrode 170.

The bent portion 164 may be a region extending outwardly from the piezoelectric portion 162 and located in the extended portion E.

The bent portion 164 is disposed on the insertion layer 180, to be described later, and is formed in a protruding shape along the shape of the insertion layer 180. Thus, the piezoelectric layer 160 is bent at a boundary between the piezoelectric portion 162 and the bent portion 164, and the bent portion 164 protrudes, corresponding to a thickness and a shape of the insertion layer 180.

The bent portion 164 may include an inclined portion 164a and an extended portion 164b.

The inclined portion 164a is a portion formed to be inclined along an inclined surface or plane L of the insertion layer 180, to be described later. The extended portion 164b is a portion extending outwardly from the inclined portion 164a.

The inclined portion 164a is formed parallel to the inclined surface L of the insertion layer 180, and an inclination angle of the inclined portion 164a is formed to be equal to an inclination angle of the inclined surface L.

The FWHM indicating the crystallinity of the piezoelectric layer 160 may be 1 degree or less. For example, as illustrated in FIG. 10, when the surface roughness of the first electrode 150 is 2.4 nm or less, based on the arithmetic mean roughness Ra, the FWHM indicating the crystallinity of the piezoelectric layer 160 is 1 degree or less. In more detail, as illustrated in FIG. 10, when the surface roughness of the scandium-containing aluminum alloy is 1.9 nm based on the arithmetic mean roughness Ra as in the first test piece (#1), FWHM indicating the crystallinity of the piezoelectric layer 160 is 0.83 deg. When the surface roughness of the scandium-containing aluminum alloy is 2.1 nm based on the arithmetic mean roughness Ra as in the third test piece (#3) of FIG. 10, the FWHM indicating the crystallinity of the piezoelectric layer 160 is 0.86 deg. When the surface roughness of the scandium-containing aluminum alloy is 2.4 nm based on the arithmetic mean roughness Ra as in the fourth test piece (#4), the FWHM indicating the crystallinity of the piezoelectric layer 160 is 0.95 deg.

The second electrode 170 is formed to cover at least a portion of the piezoelectric layer 160 disposed on an upper portion of the cavity C. The second electrode 170 may be used as either an input electrode or an output electrode for inputting or outputting, respectively, an electrical signal such as a radio frequency (RF) signal. For example, when the first electrode 150 is used as an input electrode, the second electrode 170 may be used as an output electrode, and when the first electrode 150 is used as an output electrode, the second electrode 170 may be used as an input electrode.

The second electrode 170 may also be formed of an aluminum alloy containing scandium (Sc) as in the case of the first electrode 150.

In addition, the second electrode 170 may be formed of an aluminum alloy (AlSc) containing only scandium (Sc). For example, no additional metal except scandium (Sc) is contained in the aluminum alloy. If additional metals other than scandium (Sc) are present with aluminum (Al), these aluminum alloys form a ternary phase diagram. In this case, it may be difficult to control a composition, and a complex phase system is caused, thereby causing compositional unevenness and formation of undesired crystal phase.

Further, when the second electrode is formed of an aluminum alloy having a ternary system, the surface roughness thereof is increased due to an uneven composition and undesired crystal phase formation, which may adversely affect crystal orientation when the passivation layer 190 is formed.

Therefore, the second electrode 170 is formed of an aluminum alloy (AlSc) containing only scandium (Sc), and thus, crystal orientation of the passivation layer 190 disposed on the second electrode 170 may be improved.

The insertion layer 180 is disposed between the first electrode 150 and the piezoelectric layer 160. The insertion layer 180 may be formed of a dielectric material such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenic (GaAs), hafnium oxide ($HfO_2$), aluminum oxide ($Al_2O_3$), titanium oxide ($TiO_2$), zinc oxide (ZnO), or the like, and is formed of a material different from that of the piezoelectric layer 160. Further, a region in which the insertion layer 180 is provided may also be provided as air, as required, which may be implemented by removing the insertion layer 180 during a manufacturing process.

In this embodiment, a thickness of the insertion layer 180 may be less than that of the piezoelectric layer 160. If the thickness of the insertion layer 180 were greater than that of the piezoelectric layer 160, it may be difficult to form the bent portion 164 covering the insertion layer 180. The insertion layer 180 should be formed to have a thickness of 100 Å or more such that the bent portion 164 may be easily formed, and sound waves in a horizontal direction of the bulk acoustic wave resonator 100 may be effectively prevented, thereby improving performance of the bulk acoustic wave resonator 100.

The insertion layer 180 is disposed along a surface formed by the membrane layer 140, the first electrode 150 and the etch stop portion 130.

The insertion layer 180 is disposed around the flat portion S to support the bent portion 164 of the piezoelectric layer 160. The bent portion 164 of the piezoelectric layer 160 may include the inclined portion 164a and the extended portion 164b along a shape of the insertion layer 180.

The insertion layer 180 is disposed in an area excluding the flat portion S. For example, the insertion layer 180 may be disposed over the entire region except the flat portion S, or may be disposed over a portion of the area excluding the flat portion S.

At least a portion of the insertion layer 180 is disposed between the piezoelectric layer 160 and the first electrode 150.

A side surface of the insertion layer 180 disposed along a boundary of the flat portion S is formed to have a thickness increased away from the flat portion S. Thus, the insertion layer 180 is formed to have the inclined surface L by which a side surface of the insertion layer adjacent to the flat portion S has a predetermined inclination angle ($\theta$).

If the inclination angle ($\theta$) of the side surface of the insertion layer 180 were formed to be less than 5 degrees, the insertion layer 180 would be difficult to implement, because a thickness of the insertion layer 180 would be significantly reduced, or an area of the inclined surface L would be excessively large.

If the inclination angle (θ) of the side surface of the insertion layer 180 were formed to be greater than 70 degrees, an inclination angle of the inclined portion 164a of the piezoelectric layer 160 stacked on the insertion layer 180 would be formed to be greater than 70 degrees. In this case, since the piezoelectric layer 160 would be excessively bent, a crack may occur in the bent portion of the piezoelectric layer 160.

Therefore, in the embodiment, the inclination angle (θ) of the inclined surface L is formed in a range of 5 degrees to 70 degrees.

The passivation layer 190 is formed in a region except for portions of the first electrode 150 and the second electrode 170. The passivation layer 190 prevents damage to the second electrode 170 and the first electrode 150 during a manufacturing process.

Furthermore, the passivation layer 190 may be partially removed in a final process by etching for frequency control. For example, the thickness of the passivation layer 190 may be adjusted. In an example, a dielectric layer including any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the passivation layer 190.

The metal pad 195 is formed on portions of the first electrode 150 and the second electrode 170 on which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (aluminum), an aluminum alloy, or the like. For example, the aluminum alloy may be an aluminum-germanium (Al—Ge) alloy.

As described above, since the surface roughness of the first electrode 150 is 2.4 nm or less, based on the arithmetic mean roughness Ra, crystal orientation of the piezoelectric layer 160 may be improved.

Figure 11:
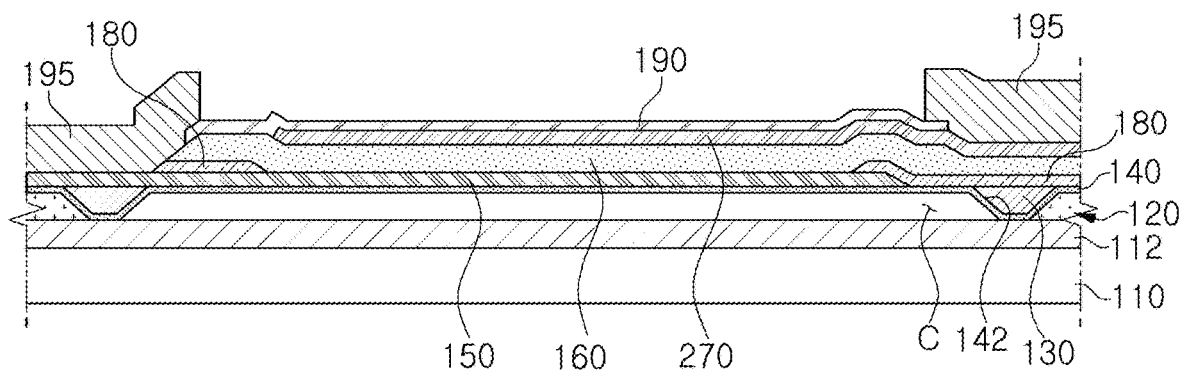
FIG. 11 is a schematic cross-sectional view illustrating a bulk acoustic wave resonator, according to another embodiment.

FIG. 11 is a schematic cross-sectional view illustrating a bulk acoustic wave resonator 200, according to another embodiment.

Referring to FIG. 11, the bulk acoustic wave resonator 200 may include the substrate 110, the sacrificial layer 120, an etch stop portion 130, the membrane layer 140, the first electrode 150, the piezoelectric layer 160, a second electrode 270, the insertion layer 180, the passivation layer 190, and the metal pad 195.

The second electrode 270 is formed to cover at least a portion of the piezoelectric layer 160 disposed on an upper portion of a cavity C. The second electrode 270 may be used as either an input electrode or an output electrode for inputting or outputting, respectively, an electrical signal such as a radio frequency (RF) signal. For example, when the first electrode 150 is used as an input electrode, the second electrode 270 may be used as an output electrode, and when the first electrode 150 is used as an output electrode, the second electrode 270 may be used as an input electrode.

The second electrode 270 may be formed using a conductive material such as molybdenum (Mo) or an alloy thereof, but the disclosure is not limited to this example. For example, the second electrode 270 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or may be formed of a layer composed of an alloy including any one of ruthenium (Ru), tungsten (W), iridium (Ir), platinum (Pt), copper (Cu), titanium (Ti), tantalum (Ta), nickel (Ni), chromium (Cr), and the like.

As described above, the first electrode 150 is formed of the aluminum alloy containing scandium (Sc), like in the first electrode 150 provided in the bulk acoustic wave resonator 100 according to the first embodiment. Furthermore, as described above, since the first electrode 150 is formed of an aluminum alloy containing scandium (Sc), mechanical strength may be increased and high power reactive sputtering may be performed. In this deposition condition, surface roughness of the first electrode 150 may be prevented from increasing and high orientation growth of the piezoelectric layer 160 may be induced.

In addition, since the scandium (Sc) is contained in the first electrode 150, chemical resistance of the first electrode 150 is increased, and disadvantage that occurs in a case in which the first electrode is formed of pure aluminum may be mitigated. Further, stability of a process such as dry etching or wet processing may be provided in manufacturing. Further, in a case in which the first electrode is formed of pure aluminum, oxidation is easily caused. However, since the first electrode 150 is formed of an aluminum alloy containing scandium, chemical resistance to oxidation may be improved.

Further, a surface roughness of the first electrode 150 may be 2.4 nm or less, based on the arithmetic mean roughness Ra.

As described above, since the surface roughness of the first electrode 150 is 2.4 nm or less, based on the arithmetic mean roughness Ra, crystal orientation of the piezoelectric layer 160 may be improved.

Figure 12:
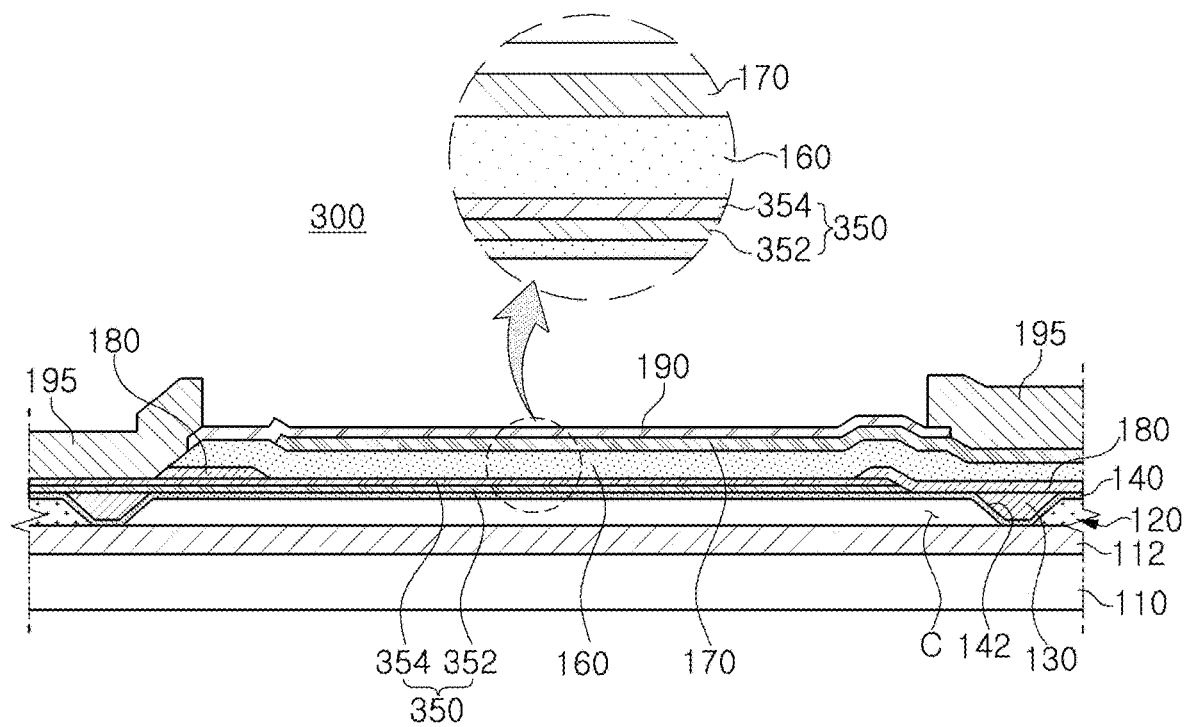
FIG. 12 is a schematic cross-sectional view illustrating a bulk acoustic wave resonator, according to another embodiment.

FIG. 12 is a schematic cross-sectional view illustrating a bulk acoustic wave resonator 300, according to another embodiment.

Referring to FIG. 12, the bulk acoustic wave resonator 300 may include the substrate 110, the sacrificial layer 120, the etch stop portion 130, the membrane layer 140, a first electrode 350, the piezoelectric layer 160, the second electrode 170, the insertion layer 180, a passivation layer 190, and a metal pad 195, by way of example.

The first electrode 350 is formed on the membrane layer 140, and a portion of the first electrode 350 is disposed on an upper portion of a cavity C. The first electrode 350 may be used as either an input electrode or an output electrode for inputting or outputting, respectively, an electrical signal such as an RF signal.

As an example, the first electrode 350 includes a first electrode layer 352 formed of an aluminum alloy containing scandium (Sc), and a second electrode layer 354 formed on the first electrode layer 352.

A surface roughness of the first electrode layer 352 may be 2.4 nm or less, based on the arithmetic mean roughness Ra. As described above, since the surface roughness of the first electrode layer 352 is 2.4 nm or less, based on the arithmetic mean roughness Ra, crystal orientation of the piezoelectric layer 160 may be improved.

The second electrode layer 354 may be formed of a conductive material such as molybdenum (Mo) or an alloy thereof, but a material of the second electrode layer 354 is not limited to molybdenum (Mo). The second electrode layer 354 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include an aluminum alloy layer including a layer composed of an alloy including any one thereof.

As described above, since the second electrode 170 and the first electrode layer 352 are formed of an aluminum alloy containing scandium (Sc), chemical resistance of the second electrode 170 and the first electrode layer 352 is increased, and disadvantages occurring in a case in which the first electrode and the second electrode are formed of pure aluminum may be mitigated. Further, stability of a process such as dry etching or wet processing may be provided in manufacturing. Further, in the case in which the first electrode and the second electrode are formed of pure aluminum, oxidation is easily caused. However, since the second electrode 170 and the first electrode layer 352 are formed of an aluminum alloy containing scandium, chemical resistance to oxidation may be improved.

Furthermore, since the surface roughness of the first electrode layer 352 is 2.4 nm or less, based on the arithmetic mean roughness Ra, crystal orientation of the piezoelectric layer 160 may be improved.

Figure 13:
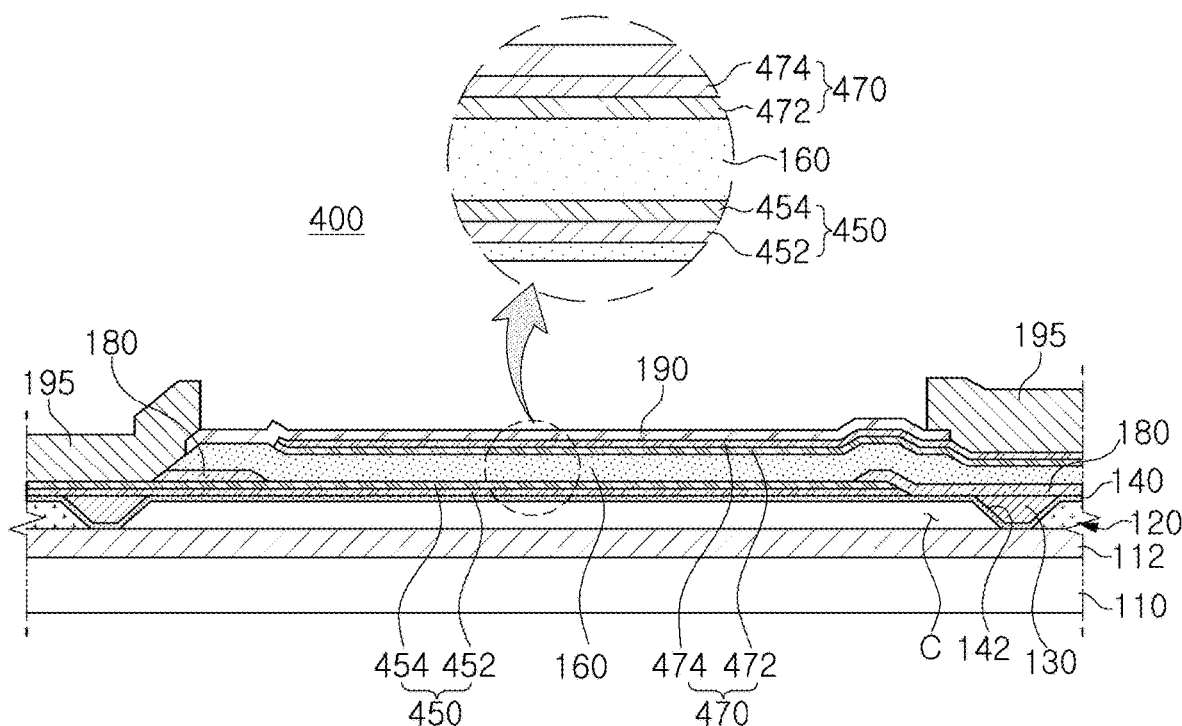
FIG. 13 is a schematic cross-sectional view illustrating a bulk acoustic wave resonator, according to another embodiment.

FIG. 13 is a schematic cross-sectional view illustrating a bulk acoustic wave resonator 400, according to another embodiment.

Referring to FIG. 13, the bulk acoustic wave resonator 400 may include the substrate 110, the sacrificial layer 120, the etch stop portion 130, the membrane layer 140, a first electrode 450, the piezoelectric layer 160, a second electrode 470, the insertion layer 180, a passivation layer 190, and a metal pad 195, by way of example.

The first electrode 450 is formed on the membrane layer 140, and a portion of the first electrode 450 is disposed on an upper portion of a cavity C. In addition, the first electrode 450 may be used as either an input electrode or an output electrode for inputting or outputting, respectively, an electrical signal such as a radio frequency (RF) signal.

As an example, the first electrode 450 includes a first electrode layer 452, and a second electrode layer 454 formed on the first electrode layer 452 and formed of an aluminum alloy containing scandium (Sc).

The first electrode layer 452 may be formed using a conductive material such as molybdenum (Mo) or an alloy thereof, but the disclosure is not limited to such an example. For example, the first electrode layer 452 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of ruthenium (Ru), tungsten (W), iridium (Ir), platinum (Pt), copper (Cu), titanium (Ti), tantalum (Ta), nickel (Ni), chromium (Cr), and the like.

Further, a surface roughness of the second electrode layer 454 may be 2.4 nm or less, based on the arithmetic mean roughness Ra. As described above, since the surface roughness of the second electrode layer 454 is 2.4 nm or less, based on the arithmetic mean roughness Ra, the crystal orientation of the piezoelectric layer 160 may be improved.

The second electrode 470 is formed to cover at least a portion of the piezoelectric layer 160 disposed on the upper portion of the cavity C. The second electrode 470 may be used as either an input electrode or an output electrode for inputting or outputting, respectively, an electrical signal such as a radio frequency (RF) signal. For example, when the first electrode 450 is used as an input electrode, the second electrode 470 may be used as an output electrode, and when the first electrode 450 is used as an output electrode, the second electrode 470 may be used as an input electrode.

The second electrode 470 includes a third electrode layer 472 formed of an aluminum alloy containing scandium (Sc), and a fourth electrode layer 474 formed on the third electrode layer 472.

The fourth electrode layer 474 may be formed using a conductive material such as molybdenum (Mo) or an alloy thereof, but the disclosure is not limited to such an example. For example, the fourth electrode layer 474 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of ruthenium (Ru), tungsten (W), iridium (Ir), platinum (Pt), copper (Cu), titanium (Ti), tantalum (Ta), nickel (Ni), chromium (Cr), and the like.

As described above, the second electrode layer 454 is formed of an aluminum alloy containing scandium (Sc). As described above, since the second electrode layer 454 is formed of an aluminum alloy containing scandium (Sc), high power reactive sputtering may be performed as mechanical strength is increased. In this deposition condition, the surface roughness of the second electrode layer 454 may be prevented from increasing and high orientation growth of the piezoelectric layer 160 may be induced.

Since the second electrode layer 454 and the third electrode layer 472 are formed of an aluminum alloy containing scandium (Sc), chemical resistance of the second electrode layer 454 and the third electrode layer 472 increases. Thus, disadvantages occurring in a case in which the first electrode and the second electrode are formed of pure aluminum may be mitigated. Further, stability of a process such as dry etching or wet processing may be provided in manufacturing. Further, oxidation occurs easily in a case in which the first electrode and the second electrode are formed of pure aluminum, but since the second and third electrode layers 454 and 472 formed of an aluminum alloy containing scandium are provided, chemical resistance to oxidation may be improved.

In addition, since the surface roughness of the second electrode layer 454 is 2.4 nm or less, based on the arithmetic mean roughness Ra, the crystallinity of the piezoelectric layer 160 may be improved.

Figure 14:
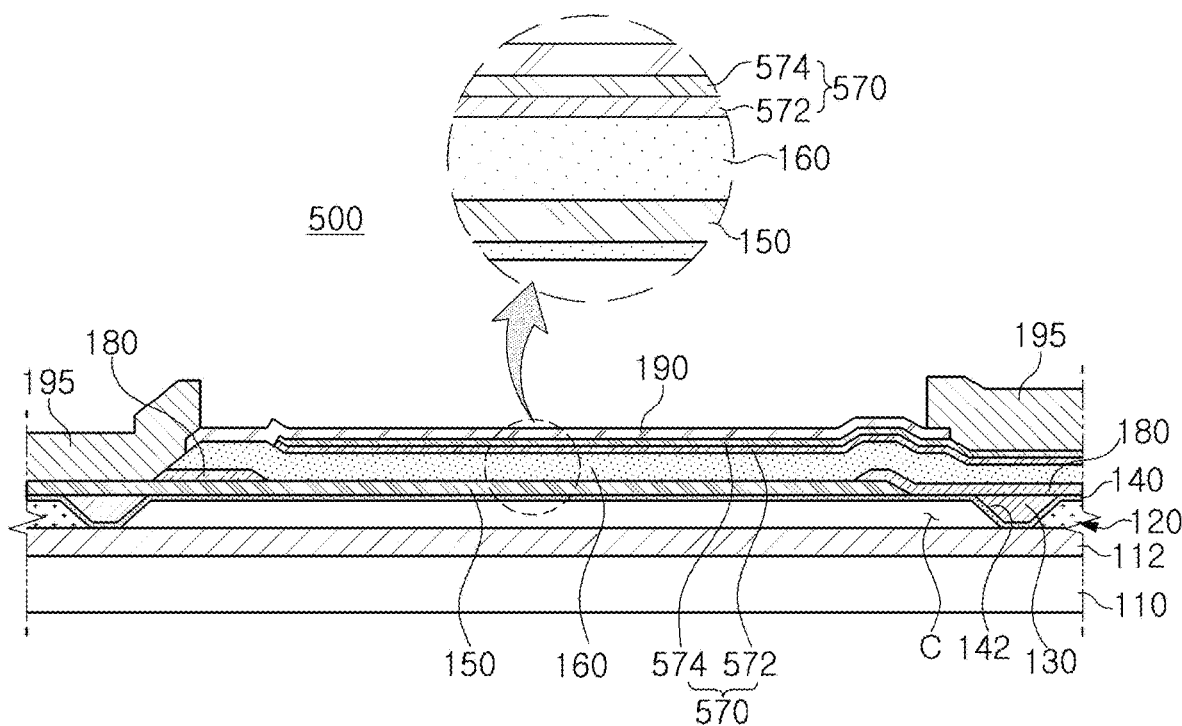
FIG. 14 is a schematic cross-sectional view illustrating a bulk acoustic wave resonator, according to another embodiment.

FIG. 14 is a schematic cross-sectional view illustrating a bulk acoustic wave resonator 500, according to another embodiment.

Referring to FIG. 14, the bulk acoustic wave resonator 500 may include the substrate 110, the sacrificial layer 120, the etch stop portion 130, the membrane layer 140, the first electrode 150, the piezoelectric layer 160, a second electrode 570, the insertion layer 180, the passivation layer 190, and the metal pad 195, by way of example.

The second electrode 570 is formed to cover at least a portion of the piezoelectric layer 160 disposed on an upper portion of a cavity C. The second electrode 570 may be used as either an input electrode or an output electrode for inputting or outputting, respectively, an electrical signal such as an RF signal. For example, when the first electrode 150 is used as an input electrode, the second electrode 570 may be used as an output electrode, and when the first electrode 150 is used as an output electrode, the second electrode 570 may be used as an input electrode.

The second electrode 570 includes a first electrode layer 572 and a second electrode layer 574 disposed on the first electrode layer 572 and formed of an aluminum alloy containing scandium (Sc).

The first electrode layer 572 may be formed of a conductive material such as molybdenum (Mo) or an alloy thereof, but the disclosure is not limited to such an example. For example, the first electrode layer 572 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of ruthenium (Ru), tungsten (W), iridium (Ir), platinum (Pt), copper (Cu), titanium (Ti), tantalum (Ta), nickel (Ni), chromium (Cr), and the like.

The first electrode 150 is formed of an aluminum alloy containing scandium (Sc). As described above, since the first electrode 150 is formed of an aluminum alloy containing scandium (Sc), mechanical strength may be increased and high power reactive sputtering may be performed. In this deposition condition, the surface roughness of the first electrode 150 may be prevented from being increased and high orientation growth of the piezoelectric layer 160 may be induced.

In addition, since the scandium (Sc) is contained in the first electrode 150, chemical resistance of the first electrode 150 is increased, and a disadvantage that occurs in a case in which the first electrode is formed of pure aluminum may be mitigated. Further, stability of a process such as dry etching or wet processing may be provided in manufacturing. Further, in a case in which the first electrode is formed of pure aluminum, oxidation is easily caused. However, since the first electrode 150 is formed of an aluminum alloy containing scandium, the chemical resistance to oxidation may be improved.

Further, the surface roughness of the first electrode 150 may be 2.4 nm or less, based on the arithmetic mean roughness Ra. As described above, since the surface roughness of the first electrode 150 is 2.4 nm or less, based on the arithmetic mean roughness Ra, the crystal orientation of the piezoelectric layer 160 may be improved.

Figure 15:
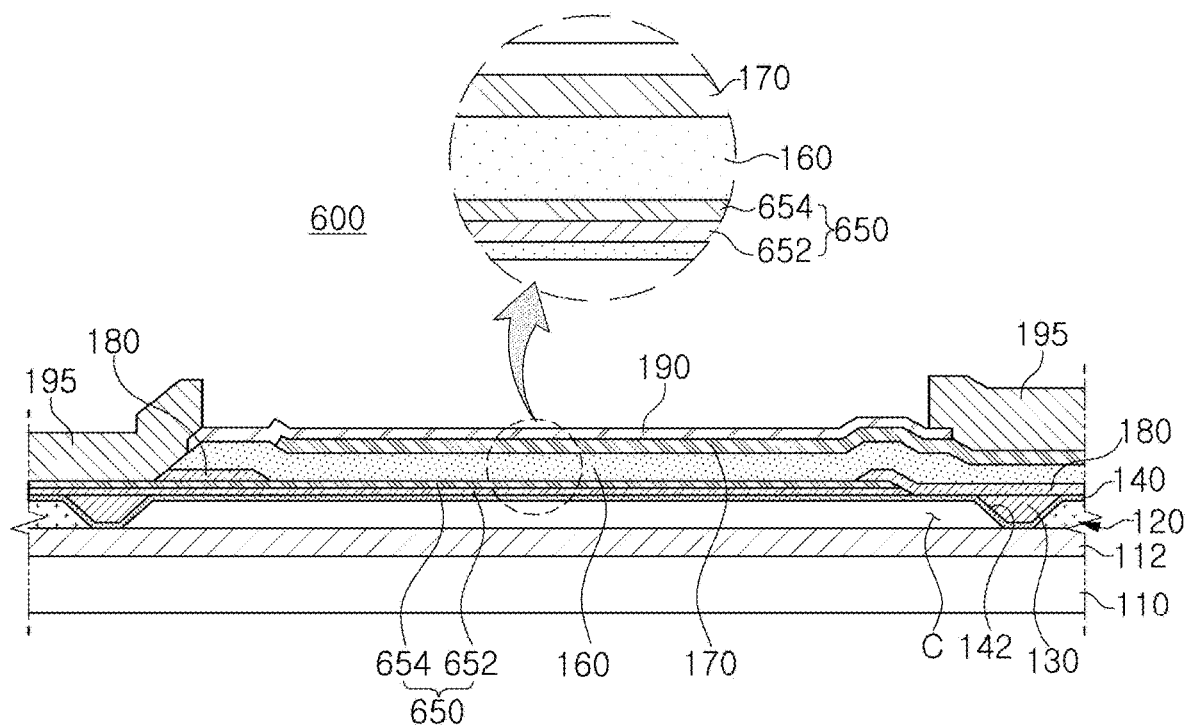
FIG. 15 is a schematic cross-sectional view illustrating a bulk acoustic wave resonator, according to another embodiment.

FIG. 15 is a schematic cross-sectional view illustrating a bulk acoustic wave resonator 600, according to another embodiment.

Referring to FIG. 15, the bulk acoustic wave resonator 600 may include the substrate 110, the sacrificial layer 120, the etch stop portion 130, the membrane layer 140, a first electrode 650, the piezoelectric layer 160, the second electrode 170, the insertion layer 180, the passivation layer 190, and the metal pad 195, by way of example.

The first electrode 650 is formed on the membrane layer 140, and a portion of the first electrode 650 is disposed on an upper portion of a cavity C. In addition, the first electrode 650 may be used as either an input electrode or an output electrode for inputting or outputting, respectively, an electrical signal such as a radio frequency (RF) signal.

As an example, the first electrode 650 includes a first electrode layer 652, and a second electrode layer 654 formed on the first electrode layer 652 and formed of an aluminum alloy containing scandium (Sc).

The first electrode layer 652 may be formed using a conductive material such as molybdenum (Mo) or an alloy thereof, but the disclosure is not limited to such an example. For example, the first electrode layer 652 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of ruthenium (Ru), tungsten (W), iridium (Ir), platinum (Pt), copper (Cu), titanium (Ti), tantalum (Ta), nickel (Ni), chromium (Cr), and the like.

A surface roughness of the second electrode layer 654 may be 2.4 nm or less, based on the arithmetic mean roughness Ra. Thus, crystallinity of the piezoelectric layer 160 may be improved since the surface roughness of the second electrode layer 654 is 2.4 nm or less, based on the arithmetic mean roughness Ra.

Figure 16:
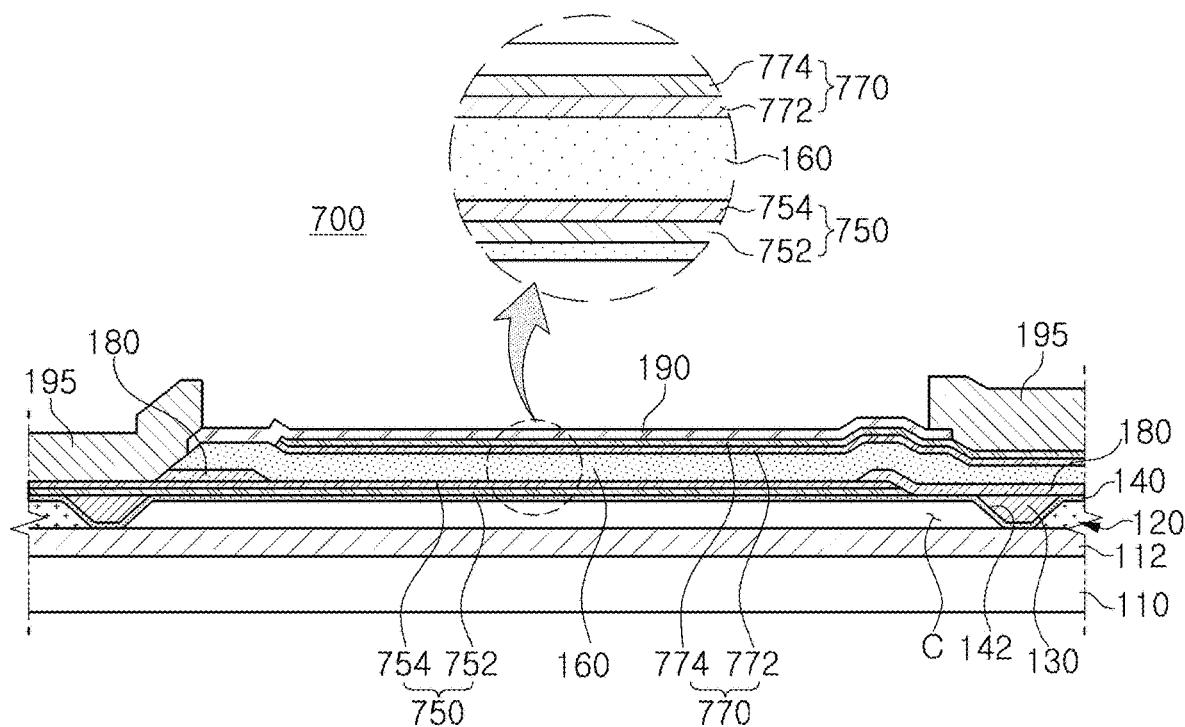
FIG. 16 is a schematic cross-sectional view illustrating a bulk acoustic wave resonator, according to another embodiment.

FIG. 16 is a schematic cross-sectional view illustrating a bulk acoustic wave resonator 700, according to another embodiment.

Referring to FIG. 16, the bulk acoustic wave resonator 700 may include the substrate 110, the sacrificial layer 120, the etch stop portion 130, the membrane layer 140, a first electrode 750, the piezoelectric layer 160, a second electrode 770, the insertion layer 180, the passivation layer 190, and the metal pad 195, by way of example.

The first electrode 750 is formed on the membrane layer 140, and a portion of the first electrode 750 is disposed on an upper portion of a cavity C. The first electrode 750 may be used as either an input electrode or an output electrode for inputting or outputting, respectively, an electrical signal such as a radio frequency (RF) signal.

As an example, the first electrode 750 includes a first electrode layer 752 formed of an aluminum alloy containing scandium (Sc), and a second electrode layer 754 formed on the first electrode layer 752.

A surface roughness of the first electrode layer 752 may be 2.4 nm or less, based on the arithmetic mean roughness Ra. As described above, since the surface roughness of the first electrode layer 752 is 2.4 nm or less, based on the arithmetic mean roughness Ra, crystallinity of the piezoelectric layer 160 may be improved.

The second electrode layer 754 may be formed of a conductive material such as molybdenum (Mo) or an alloy thereof, but the disclosure is not limited to such an example. The second electrode layer 754 may be formed of a conductive material such as ruthenium (Ru), tungsten (W), iridium (Ir), platinum (Pt), titanium (Ti), tantalum (Ta), nickel (Ni), chromium (Cr), or the like, or may include a layer formed of an alloy including any one of ruthenium (Ru), tungsten (W), iridium (Ir), platinum (Pt), titanium (Ti), tantalum (Ta), nickel (Ni), chromium (Cr), and the like.

The second electrode 770 is formed to cover at least a portion of the piezoelectric layer 160 disposed on the upper portion of the cavity C. The second electrode 770 may be used as either an input electrode or an output electrode for inputting or outputting, respectively, an electrical signal such as a radio frequency (RF) signal. For example, when the first electrode 750 is used as an input electrode, the second electrode 770 may be used as an output electrode, and when the first electrode 750 is used as an output electrode, the second electrode 770 may be used as an input electrode.

The second electrode 770 includes a third electrode layer 772, and a fourth electrode layer 774 disposed on the third electrode layer 772 and formed of an aluminum alloy containing scandium (Sc).

The third electrode layer 772 may be formed of a conductive material such as molybdenum (Mo) or an alloy thereof, but the disclosure is not limited to such an embodiment. The third electrode layer 772 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of.

Figure 17:
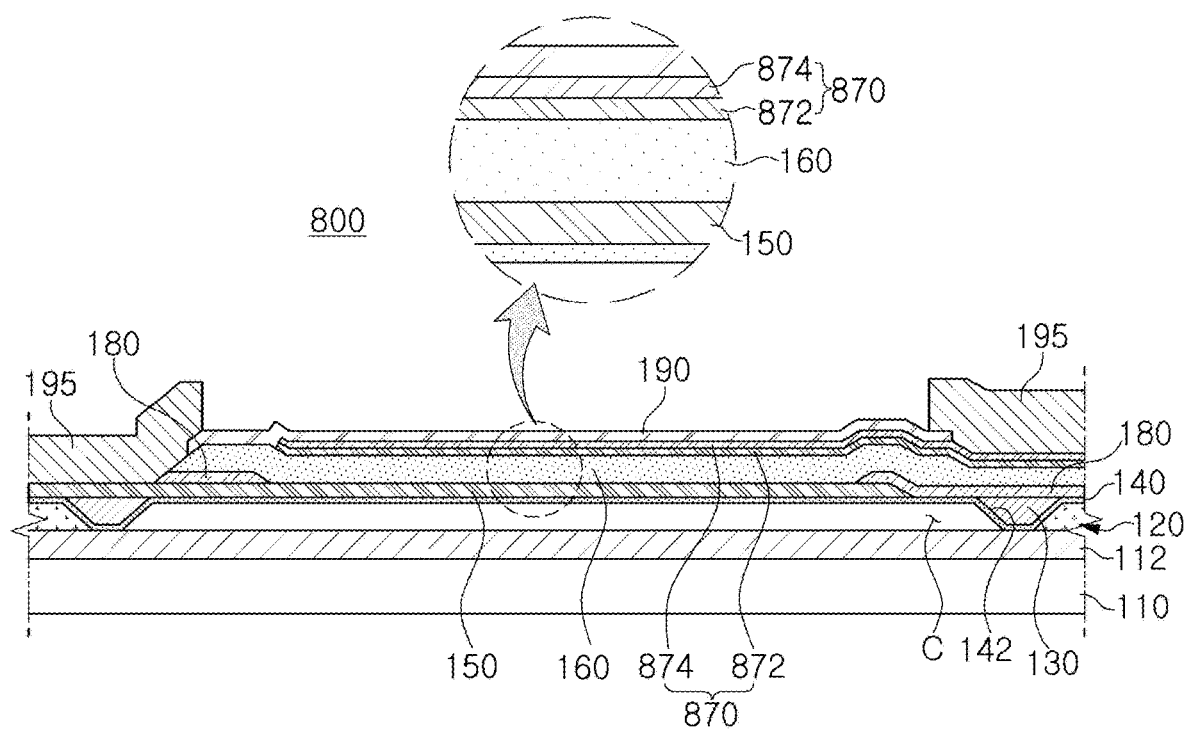
FIG. 17 is a schematic cross-sectional view illustrating a bulk acoustic wave resonator, according to another embodiment.

FIG. 17 is a schematic cross-sectional view illustrating a bulk acoustic wave resonator 800, according to another embodiment.

Referring to FIG. 17, the bulk acoustic wave resonator 800 may include the substrate 110, the sacrificial layer 120, the etch stop portion 130, the membrane layer 140, the first electrode 150, the piezoelectric layer 160, a second electrode 870, the insertion layer 180, the passivation layer 190, and the metal pad 195, by way of example.

The second electrode 870 is formed to cover at least a portion of the piezoelectric layer 160 disposed on an upper portion of a cavity C. The second electrode 870 may be used as either an input electrode or an output electrode for inputting or outputting, respectively, an electrical signal such as a radio frequency (RF) signal. For example, when the first electrode 150 is used as an input electrode, the second electrode 870 may be used as an output electrode, and when the first electrode 150 is used as an output electrode, the second electrode 870 may be used as an input electrode.

The second electrode 870 includes a first electrode layer 872 formed of an aluminum alloy containing scandium (Sc), and a second electrode layer 874 formed on the first electrode layer 872.

The second electrode layer 874 may be formed using a conductive material such as molybdenum (Mo) or an alloy thereof, but the disclosure is not limited to such an example. The second electrode layer 874 may be formed of ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of ruthenium (Ru), tungsten (W), iridium (Ir), platinum (Pt), copper (Cu), titanium (Ti), tantalum (Ta), nickel (Ni), chromium (Cr), and the like.

The first electrode 150 is formed of an aluminum alloy containing scandium (Sc). As described above, since the first electrode 150 is formed of an aluminum alloy containing scandium (Sc), mechanical strength may be increased and high power reactive sputtering may be performed. In this deposition condition, the surface roughness of the first electrode 150 may be prevented from increasing, and high orientation growth of the piezoelectric layer 160 may be induced.

In addition, since the scandium (Sc) is contained in the first electrode 150, chemical resistance of the first electrode 150 is increased, and disadvantage that occurs in a case in which the first electrode is formed of pure aluminum may be mitigated. Further, stability of a process such as dry etching or wet processing may be provided in manufacturing. Further, in a case in which the first electrode is formed of pure aluminum, oxidation is easily caused. However, since the first electrode 150 is formed of an aluminum alloy containing scandium, chemical resistance to oxidation may be improved.

Further, the surface roughness of the first electrode 150 may be 2.4 nm or less, based on the arithmetic mean roughness Ra. As described above, since the surface roughness of the first electrode 150 is 2.4 nm or less, based on the arithmetic mean roughness Ra, crystal orientation of the piezoelectric layer 160 may be improved.

Figure 18:
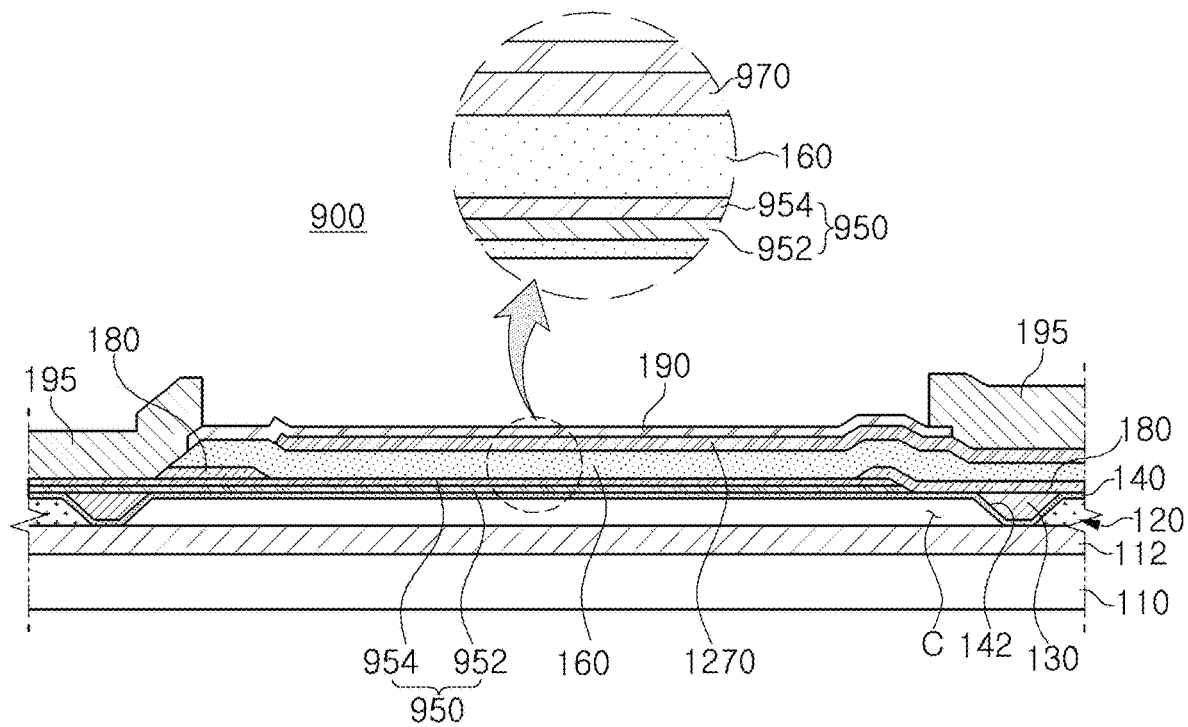
FIG. 18 is a schematic cross-sectional view illustrating a bulk acoustic wave resonator according to a ninth embodiment of the present disclosure.

FIG. 18 is a schematic cross-sectional view illustrating a bulk acoustic wave resonator 900, according to another embodiment.

Referring to FIG. 18, the bulk acoustic wave resonator 900 may include the substrate 110, the sacrificial layer 120, the etch stop portion 130, the membrane layer 140, a first electrode 950, the piezoelectric layer 160, a second electrode 970, the insertion layer 180, the passivation layer 190, and the metal pad 195, by way of example.

The first electrode 950 is formed on the membrane layer 140, and a portion of the first electrode 950 is disposed on an upper portion of a cavity C. The first electrode 950 may be used as either an input electrode or an output electrode for inputting or outputting, respectively, an electrical signal such as a radio frequency (RF) signal.

As an example, the first electrode 950 includes a first electrode layer 952 formed of an aluminum alloy containing scandium (Sc), and a second electrode layer 954 formed on the first electrode layer 952.

A surface roughness of the first electrode layer 952 may be 2.4 nm or less, based on the arithmetic mean roughness Ra. As described above, since the surface roughness of the first electrode layer 952 is 2.4 nm or less, based on the arithmetic mean roughness Ra, crystallinity of the piezoelectric layer 160 may be improved.

The second electrode layers 954 may be formed of a conductive material such as molybdenum (Mo) or an alloy thereof, but the disclosure is not limited to such an example. The second electrode layer 954 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of ruthenium (Ru), tungsten (W), iridium (Ir), platinum (Pt), copper (Cu), titanium (Ti), tantalum (Ta), nickel (Ni), chromium (Cr), and the like.

The second electrode 970 is formed to cover at least a portion of the piezoelectric layer 160 disposed on the upper portion of the cavity C. The second electrode 970 may be used as either an input electrode or an output electrode for inputting or outputting, respectively, an electrical signal such as a radio frequency (RF) signal. For example, when the first electrode 950 is used as an input electrode, the second electrode 970 may be used as an output electrode, and when the first electrode 950 is used as an output electrode, the second electrode 970 may be used as an input electrode.

The second electrode 970 may be formed using a conductive material such as molybdenum (Mo) or an alloy thereof as an example, but the disclosure is not limited to such an example. The second electrode 970 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of ruthenium (Ru), tungsten (W), iridium (Ir), platinum (Pt), copper (Cu), titanium (Ti), tantalum (Ta), nickel (Ni), chromium (Cr), and the like.

Figure 19:
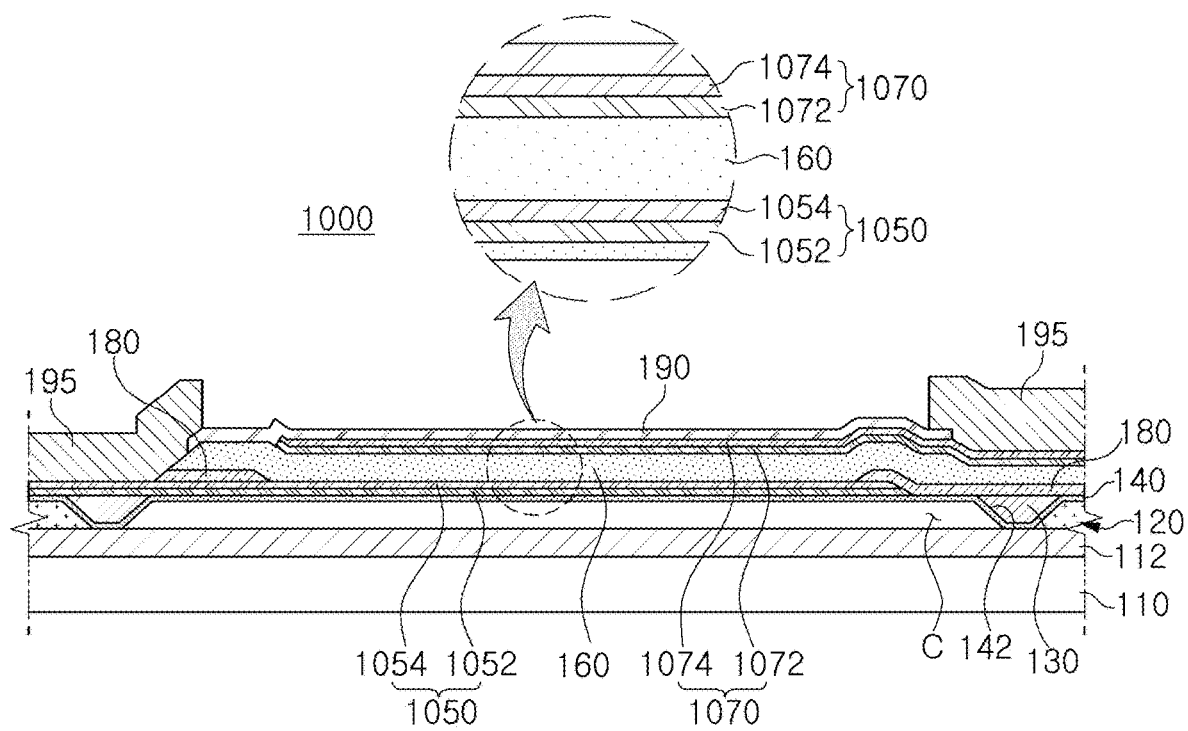
FIG. 19 is a schematic cross-sectional view illustrating a bulk acoustic wave resonator, according to another embodiment.

FIG. 19 is a schematic cross-sectional view illustrating a bulk acoustic wave resonator 1000, according to another embodiment.

Referring to FIG. 19, the bulk acoustic wave resonator 1000 may be include the substrate 110, the sacrificial layer 120, the etch stop portion 130, the membrane layer 140, a first electrode 1050, the piezoelectric layer 160, a second electrode 1070, the insertion layer 180, the passivation layer 190, and the metal pad 195.

The first electrode 1050 is formed on the membrane layer 140, and a portion of the first electrode 1050 is disposed on an upper portion of a cavity C. The first electrode 1050 may be used as either an input electrode or an output electrode for inputting or outputting, respectively, an electrical signal such as a radio frequency (RF) signal.

As an example, the first electrode 1050 includes a first electrode layer 1052 formed of an aluminum alloy containing scandium (Sc), and a second electrode layer 1054 formed on the first electrode layer 1052.

A surface roughness of the first electrode layer 1052 may be 2.4 nm or less, based on the arithmetic mean roughness Ra. As described above, since the surface roughness of the first electrode layer 1052 is 2.4 nm or less, based on the arithmetic mean roughness Ra, crystallinity of the piezoelectric layer 160 may be improved.

The second electrode layer 1054 may be formed using a conductive material such as molybdenum (Mo) or an alloy thereof, but the disclosure is not limited to such an example. The second electrode layer 1054 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of these elements.

The second electrode 1070 is formed to cover at least a portion of the piezoelectric layer 160 disposed on the upper portion of the cavity C. The second electrode 1070 may be used as either an input electrode or an output electrode for inputting or outputting, respectively, an electrical signal such as a radio frequency (RF) signal. For example, when the first electrode 1050 is used as an input electrode, the second electrode 1070 may be used as an output electrode, and when the first electrode 1050 is used as an output electrode, the second electrode 1070 may be used as an input electrode.

The second electrode 1070 includes a third electrode layer 1072 formed of an aluminum alloy containing scandium (Sc), and a fourth electrode layer 1074 formed on the third electrode layer 1072.

The fourth electrode layer 1074 may be formed using a conductive material such as molybdenum (Mo) or an alloy thereof, but the disclosure is not limited to such an example. For example, the fourth electrode layer 1074 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of these elements.

Figure 20:
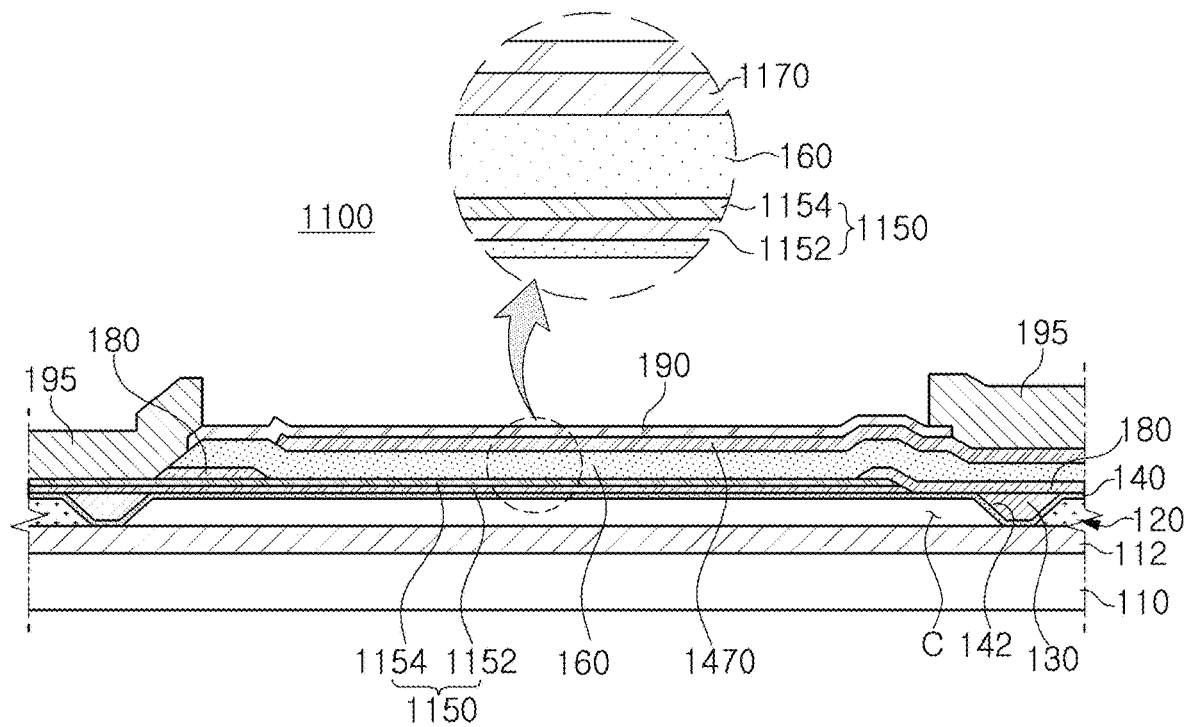
FIG. 20 is a schematic cross-sectional view illustrating a bulk acoustic wave resonator, according to another embodiment.

FIG. 20 is a schematic cross-sectional view illustrating a bulk acoustic wave resonator 1100, according to another embodiment.

Referring to FIG. 20, the bulk acoustic wave resonator 1100 may include the substrate 110, the sacrificial layer 120, the etch stop portion 130, the membrane layer 140, a first electrode 1150, the piezoelectric layer 160, a second electrode 1170, the insertion layer 180, the passivation layer 190, and the metal pad 195.

The first electrode 1150 is formed on the membrane layer 140 and a portion of the first electrode 1150 is disposed on an upper portion of the cavity C. The first electrode 1150 may be used as either an input electrode or an output electrode for inputting or outputting, respectively, an electrical signal such as a radio frequency (RF) signal.

As an example, the first electrode 1150 includes a first electrode layer 1152, and a second electrode layer 1154 formed on an upper portion of the first electrode layer 1152 and formed of an aluminum alloy containing scandium (Sc).

The first electrode layer 1152 may be formed using a conductive material such as molybdenum (Mo) or an alloy thereof. The first electrode layer 1152 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of these elements.

The surface roughness of the second electrode layer 1154 may be 2.4 nm or less, based on the arithmetic mean roughness Ra. Thus, the crystallinity of the piezoelectric layer 160 may be improved since the surface roughness of the second electrode layer 1154 is 2.4 nm or less, based on the arithmetic mean roughness Ra.

The second electrode 1170 is formed to cover at least a portion of the piezoelectric layer 160 disposed on the upper portion of the cavity C. The second electrode 1170 may be used as either an input electrode or an output electrode for inputting or outputting, respectively, an electrical signal such as a radio frequency (RF) signal. For example, when the first electrode 1150 is used as an input electrode, the second electrode 1170 may be used as an output electrode, and when the first electrode 1150 is used as an output electrode, the second electrode 1170 may be used an input electrode.

The second electrode 1170 may be formed using a conductive material such as molybdenum (Mo) or an alloy thereof as an example, but the disclosure is not limited to such an example. The second electrode 1170 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of these elements.

Figure 21:
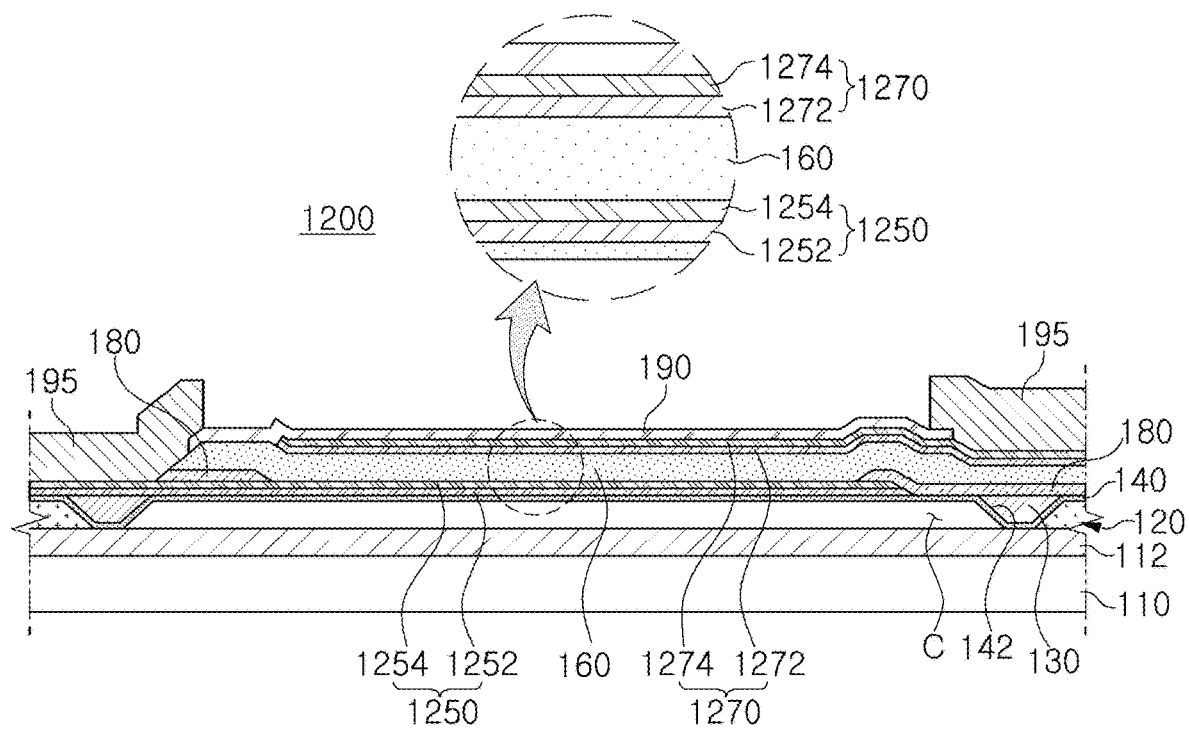
FIG. 21 is a schematic cross-sectional view illustrating a bulk acoustic wave resonator, according to another embodiment.

FIG. 21 is a schematic cross-sectional view illustrating a bulk acoustic wave resonator 1200, according to another embodiment.

Referring to FIG. 21, the bulk acoustic wave resonator 1200 may include the substrate 110, the sacrificial layer 120, the etch stop portion 130, the membrane layer 140, a first electrode 1250, the piezoelectric layer 160, a second electrode 1270, the insertion layer 180, the passivation layer 190, and the metal pad 195.

The first electrode 1250 is formed on the membrane layer 140 and a portion of the first electrode 1250 is disposed on an upper portion of a cavity C. The first electrode 1250 may be used as either an input electrode or an output electrode for inputting or outputting, respectively, an electrical signal such as a radio frequency (RF) signal or the like.

As an example, the first electrode 1250 includes a first electrode layer 1252, and a second electrode layer 1254 formed on the first electrode layer 1252 and formed of an aluminum alloy containing scandium (Sc).

The first electrode layer 1252 may be formed using a conductive material such as molybdenum (Mo) or an alloy thereof, but the disclosure is not limited to such an example. The first electrode layer 1552 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of these elements.

A surface roughness of the second electrode layer 1254 may be 2.4 nm or less, based on the arithmetic mean roughness Ra. Thus, the crystallinity of the piezoelectric layer 160 may be improved since the surface roughness of the second electrode layer 1254 is 2.4 nm or less, based on the arithmetic mean roughness Ra.

The second electrode 1270 is formed to cover at least a portion of the piezoelectric layer 160 disposed on the upper portion of the cavity C. The second electrode 1270 may be used as either an input electrode or an output electrode for inputting or outputting, respectively, an electrical signal such as a radio frequency (RF) signal. For example, when the first electrode 1250 is used as an input electrode, the second electrode 1270 may be used as an output electrode, and when the first electrode 1250 is used as an output electrode, the second electrode 1270 may be used as an input electrode.

The second electrode 1270 includes a third electrode layer 1272, and a fourth electrode layer 1274 disposed on the third electrode layer 1272 and formed of an aluminum alloy and containing scandium (Sc).

The third electrode layer 1272 may be formed using a conductive material such as molybdenum (Mo) or an alloy thereof, but the disclosure is not limited to such an example. The second electrode layer 1272 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or may include a layer formed of an alloy including any one of these elements.

Figure 22:
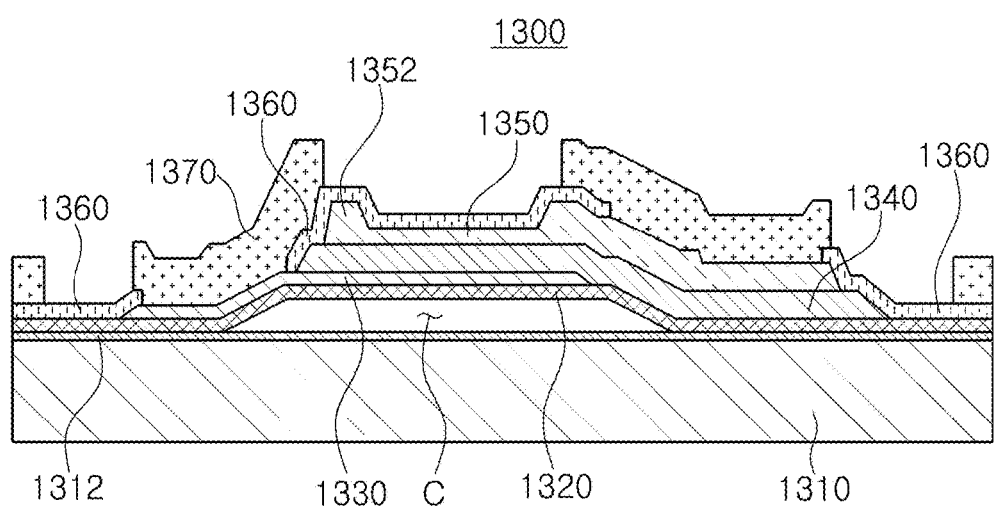
FIG. 22 is a schematic cross-sectional view illustrating a bulk acoustic wave resonator, according to another embodiment.

FIG. 22 is a schematic cross-sectional view illustrating a bulk acoustic wave resonator 1300, according to another embodiment.

Referring to FIG. 22, the bulk acoustic wave resonator 1300 may include a substrate 1310, a membrane layer 1320, a first electrode 1330, a piezoelectric layer 1340, a second electrode 1350, a passivation layer 1360, and a metal pad 1370.

The substrate 1310 may be a substrate on which silicon is accumulated. For example, a silicon wafer may be used as the substrate. A substrate protective layer 1312, which is disposed to face a cavity C, may be disposed on the substrate 1310.

The substrate protective layer 1312 may prevent the substrate 1310 from being damaged when the cavity C is formed.

As an example, the substrate protective layer 1312 may be formed of any one or any combination of any two or more of silicon dioxide ($SiO_2$), silicon nitride ($Si_3N_4$), aluminum oxide ($Al_2O_3$), and aluminum nitride (AlN), and may be formed using a process among chemical vapor deposition, RF magnetron sputtering, and evaporation.

The membrane layer 1320 is formed on an upper portion of a sacrificial layer (not illustrated) that is ultimately removed. The membrane layer 1320 forms the cavity C together with the substrate protective layer 1312 through removal of the sacrificial layer. For example, the cavity C may be formed by forming a sacrificial layer for formation of the cavity C on the substrate 1310, and then removing the sacrificial layer. A dielectric layer including one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the membrane layer 1320.

A seed layer (not illustrated) formed of aluminum nitride (AlN) may be formed on the membrane layer 1320. For example, the seed layer may be disposed between the membrane layer 1320 and the first electrode 1330. The seed layer may be formed using a dielectric or a metal having an HCP crystal structure in addition to aluminum nitride (AlN). For example, when the seed layer is a metal layer, the seed layer may be formed of titanium (Ti).

The first electrode 1330 is formed on the membrane layer 1320. The first electrode 1330 may be used as either an input electrode or an output electrode for inputting or outputting, respectively, an electrical signal such as a radio frequency (RF) signal.

As an example, the first electrode 1330 may be formed of an aluminum alloy containing scandium (Sc). As described above, since the first electrode 1330 is formed of an aluminum alloy containing scandium (Sc), mechanical strength may be increased and high power reactive sputtering may be performed. Surface roughness of the first electrode 1330 may be prevented from increasing, and high orientation growth of the piezoelectric layer 1340 may be induced under such deposition conditions.

Also, since scandium (Sc) is contained, chemical resistance of the first electrode 1330 is increased to compensate for disadvantage occurring in a case in which the first electrode is formed of pure aluminum. Further, stability of a process such as dry etching, wet processing or the like may be provided in manufacturing. Further, when the first electrode is formed of pure aluminum, oxidation is easily caused. However, since the first electrode 1330 is formed of an aluminum alloy containing scandium, chemical resistance to oxidation may be improved.

The surface roughness of the first electrode 1330 may be 2.4 nm or less, based on the arithmetic mean roughness Ra. As described above, since the surface roughness of the first electrode 1330 is 2.4 nm or less, based on the arithmetic mean roughness Ra, the crystal orientation of the piezoelectric layer 1340 may be improved.

The piezoelectric layer 1340 is formed to cover at least a portion of the first electrode 1330. The piezoelectric layer 1340 may cause a piezoelectric effect to convert electrical energy into mechanical energy in the form of acoustic waves, and may be formed of any one of aluminum nitride (AlN), zinc oxide (ZnO), and lead zirconium titanium oxide (PZT; PbZrTiO). In detail, for example, when the piezoelectric layer 1340 is formed of aluminum nitride (AlN), the piezoelectric layer 1340 may further include a rare earth metal. As an example, the rare earth metal may include any one or any combination of any two or more of scandium (Sc), erbium (Er), yttrium (Y), and lanthanum (La). Also, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included.

The crystallinity (FWHM) of the piezoelectric layer 1340 may be 2 deg. or less.

The second electrode 1350 is formed to cover at least a portion of the piezoelectric layer 1340 disposed on the upper portion of the cavity C. The second electrode 1350 may be used as either an input electrode or an output electrode for inputting or outputting, respectively, an electrical signal such as a radio frequency (RF) signal. For example, when the first electrode 1330 is used as an input electrode, the second electrode 1350 may be used as an output electrode, and when the first electrode 1330 is used as an output electrode, the second electrode 1350 may be used as an input electrode.

The second electrode 1350 may be formed of an aluminum alloy containing scandium (Sc), as in the case of the first electrode 1330.

The second electrode 1350 may include a frame portion 1352 disposed at an edge of an active region, for example, a region in which the first electrode 1330, the piezoelectric layer 1340, and the second electrode 1350 are overlapped. The frame portion 1352 has a thickness greater than that of a remaining portion of the second electrode 1350. In an example, the frame portion 1352 reflects a lateral wave generated during resonance to an inside of the active region to confine resonance energy in the active region.

The passivation layer 1360 is formed in a region excluding portions of the first electrode 1330 and the second electrode 1350. The passivation layer 1360 prevents the second electrode 1350 and the first electrode 1330 from being damaged during a manufacturing process.

Further, a thickness of the passivation layer 1360 may be adjusted by etching in a final process, to control a frequency. The passivation layer 1360 may be formed using the same material as that of the membrane layer 1320. In an example, a dielectric layer including one of manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the passivation layer 1360.

The metal pad 1370 is formed on portions of the first electrode 1330 and the second electrode 1350 in which the passivation layer 1360 is not formed. As an example, the metal pad 1370 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

Figure 23:
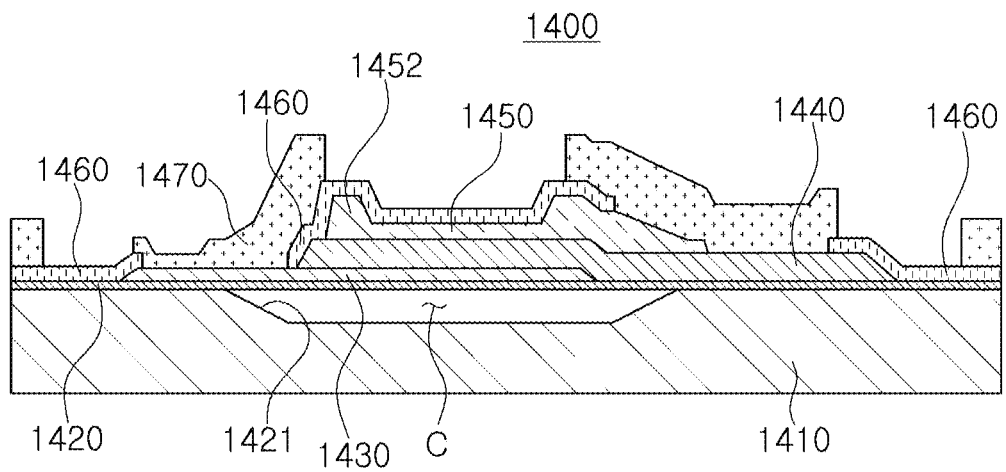
FIG. 23 is a schematic cross-sectional view illustrating a bulk acoustic wave resonator, according to another embodiment.

FIG. 23 is a schematic cross-sectional view illustrating a bulk acoustic wave resonator 1400, according to another embodiment.

Referring to FIG. 23, the acoustic wave resonator 1400 may include a substrate 1410, a membrane layer 1420, a first electrode 1430, a piezoelectric layer 1440, a second electrode 1450, a passivation layer 1460, and a metal pad 1470.

The substrate 1410 may be a substrate on which silicon is accumulated. For example, a silicon wafer may be used as the substrate 1410. The substrate 1410 may include a groove 1421 for formation of a cavity C.

The groove 1421 may be disposed in a central portion of the substrate 1410, and may be disposed below an active region. In this case, the active region is a region in which the first electrode 1430, the piezoelectric layer 1440, and the second electrode 1450 overlap.

The membrane layer 1420 forms the cavity C together with the substrate 1410. For example, the membrane layer 1420 may be formed to cover the groove 1421 of the substrate 1410. A dielectric layer including any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the membrane layer 1420.

A seed layer (not illustrated) formed of aluminum nitride (AlN) may be formed on the membrane layer 1420. For example, the seed layer may be disposed between the membrane layer 1420 and the first electrode 1430. The seed layer may be formed using a dielectric or metal having an HCP crystal structure in addition to aluminum nitride (AlN). As an example, when the seed layer is a metal layer, the seed layer may be formed of titanium (Ti).

The first electrode 1430 is formed on the membrane layer 1420. The first electrode 1430 may be used as either an input electrode or an output electrode for inputting or outputting, respectively, an electrical signal such as a radio frequency (RF) signal.

The first electrode 1430 may be formed of an aluminum alloy containing scandium (Sc) as an example. As described above, since the first electrode 1430 is formed of an aluminum alloy containing scandium (Sc), mechanical strength may be increased and high power reactive sputtering may be performed. In this deposition condition, an increase in the surface roughness of the first electrode 1430 may be prevented and high orientation growth of the piezoelectric layer 1440 may be induced.

In addition, since the scandium (Sc) is contained in the first electrode 1430, chemical resistance of the first electrode 1430 is increased, and a defect occurring in a case in which the first electrode is formed of pure aluminum may be mitigated. Further, stability of a process such as dry etching or wet processing may be secured in manufacturing. Further, in a case in which the first electrode is formed of pure aluminum, oxidation is easily caused. However, since the first electrode 1430 is formed of an aluminum alloy containing scandium, chemical resistance to oxidation may be improved.

A surface roughness of the first electrode 1430 may be 2.4 nm or less, based on the arithmetic mean roughness Ra. As described above, since the surface roughness of the first electrode 1430 is 2.4 nm or less, based on the arithmetic mean roughness Ra, crystal orientation of the piezoelectric layer 1440 may be improved.

The piezoelectric layer 1440 is formed to cover at least a portion of the first electrode 1430. The piezoelectric layer 1440 is a part causing a piezoelectric effect to convert electrical energy into mechanical energy in the form of acoustic wave, and may be formed of any one of aluminum nitride (AlN), zinc oxide (ZnO) and lead zirconium titanium oxide (PZT; $PbZrTiO$). In addition, when the piezoelectric layer 1440 is formed of aluminum nitride (AlN), the piezoelectric layer 1440 may further include a rare earth metal. As an example, the rare earth metal may include at least one of scandium (Sc), erbium (Er), yttrium (Y), and lanthanum (La). Also, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included.

The crystallinity (FWHM) of the piezoelectric layer 1440 may be 2 degrees or less.

The second electrode 1450 is formed to cover at least a portion of the piezoelectric layer 1440 disposed on an upper portion of the cavity C. The second electrode 1450 may be used as one of an input electrode and an output electrode for inputting or outputting, respectively, an electrical signal such as a radio frequency (RF) signal. For example, when the first electrode 1430 is used as an input electrode, the second electrode 1450 may be used as an output electrode, and when the first electrode 1430 is used as an output electrode, the second electrode 1450 may be used as an input electrode.

The second electrode 1450 may also be formed of an aluminum alloy including scandium (Sc) like the first electrode 1430.

In addition, the second electrode 1450 may include a frame portion 1452 disposed at an edge of the active region. The frame portion 1452 has a thickness greater than that of a remaining portion of the second electrode 1450. For example, the frame portion 1452 reflects a lateral wave generated during resonance to the inside of the active region to confine resonance energy in the active region.

The passivation layer 1460 is formed in a region excluding portions of the first electrode 1430 and the second electrode 1450. The passivation layer 1460 prevents damage to the second electrode 1450 and the first electrode 1430 during a manufacturing process.

Further, a thickness of the passivation layer 1460 may be adjusted in a final process by etching to adjust a frequency. The passivation layer 1460 may be formed using the same material as that used for the membrane layer 1420. For example, a dielectric layer including any one of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 1460.

The metal pad 1470 is formed on portions of the first electrode 1430 and the second electrode 1450 in which the passivation layer 1460 is not formed. As an example, the metal pad 1470 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

Figure 24:
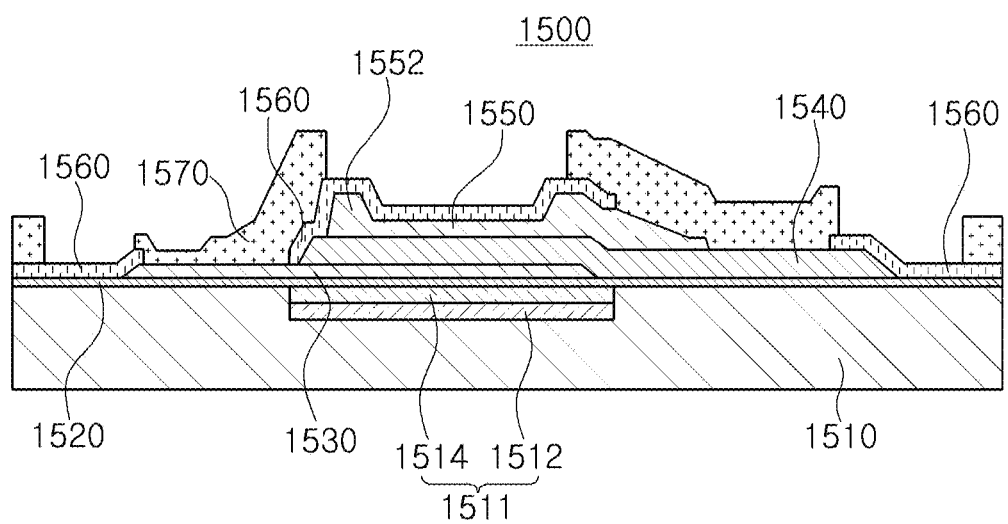
FIG. 24 is a schematic cross-sectional view illustrating a bulk acoustic wave resonator, according to another embodiment.

FIG. 24 is a schematic cross-sectional view illustrating a bulk acoustic wave resonator 1500, according to another embodiment.

Referring to FIG. 24, the bulk acoustic wave resonator 1500 may include a substrate 1510, a membrane layer 1520, a first electrode 1530, a piezoelectric layer 1540, a second electrode 1550, a passivation layer 1560, and a metal pad 1570.

The substrate 1510 may be a substrate on which silicon is accumulated. For example, a silicon wafer may be used as the substrate 1510. The substrate 1510 may include a reflective layer 1511.

The reflective layer 1511 may be formed at a central portion of the substrate 1510, and may be disposed below the active region. In this case, the active region is a region in which the first electrode 1530, the piezoelectric layer 1540, and the second electrode 1550 are overlapped with each other.

The reflective layer 1511 may include first and second reflective members 1512 and 1514 disposed in a groove. The first and second reflective members 1512 and 1514 may be formed of different materials.

The first reflective member 1512 may be formed using a conductive material such as molybdenum (Mo) or an alloy thereof, but the disclosure is not limited to such an example. For example, ruthenium (Ru), tungsten (W), iridium (Ir), platinum (Pt), copper (Cu), aluminum (Al), titanium (Ti), tantalum (Ta), nickel (Ni), chromium (Cr) or the like may be used as a material of the first reflective member 1512. A dielectric layer including any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$) and zinc oxide (ZnO) may be used as the second reflective member 1514. Also, the first and second reflective members 1512 and 1514 may be formed as only one pair, or the first and second reflective members 1512 and 1514 may be repeatedly formed as a pair.

The membrane layer 1520 may be formed to cover the reflective layer 1511. A dielectric layer including any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the membrane layer 1520.

A seed layer (not illustrated) formed of aluminum nitride (AlN) may be formed on the membrane layer 1520. For example, the seed layer may be disposed between the membrane layer 1520 and the lower electrode 1530. The seed layer may be formed using a dielectric or metal having an HCP crystal structure in addition to aluminum nitride (AlN). For example, when the seed layer is a metal layer, the seed layer may be formed of titanium (Ti).

The first electrode 1530 is formed on the membrane layer 1520. Also, the first electrode 1530 may be used as either an input electrode or an output electrode for inputting or outputting, respectively, an electrical signal such as a radio frequency (RF) signal.

The first electrode 1530 may be formed of an aluminum alloy containing scandium (Sc) as an example. As described above, since the first electrode 1530 is formed of an aluminum alloy containing scandium (Sc), mechanical strength may be increased and high power reactive sputtering may be performed. Under such deposition conditions, an increase in surface roughness of the first electrode 1530 may be prevented and high orientation growth of the piezoelectric layer 1540 may be induced.

In addition, since the scandium (Sc) is contained in the first electrode 1530, chemical resistance of the first electrode 1530 is increased, and disadvantage that occurs in a case in which the first electrode is formed of pure aluminum may be mitigated. Further, stability of a process such as dry etching or wet processing may be provided in manufacturing. Further, in a case in which the first electrode is formed of pure aluminum, oxidation is easily caused. However, since the first electrode 1530 is formed of an aluminum alloy containing scandium, chemical resistance to oxidation may be improved.

The surface roughness of the first electrode 1530 may be 2.4 nm or less, based on the arithmetic mean roughness Ra. As described above, since the surface roughness of the first electrode 1530 is 2.4 nm or less, based on the arithmetic mean roughness Ra, crystal orientation of the piezoelectric layer 1540 may be improved.

The piezoelectric layer 1540 is formed to cover at least a portion of the first electrode 1530. The piezoelectric layer 1540 may be a part causing a piezoelectric effect to convert electrical energy into mechanical energy in the form of acoustic waves, and may be formed of any one of aluminum nitride (AlN), zinc oxide (ZnO), and lead zirconium titanium oxide (PZT; PbZrTiO). For example, when the piezoelectric layer 1540 is formed of aluminum nitride (AlN), the piezoelectric layer 1540 may further include a rare earth metal. As an example, the rare earth metal may include any one or any combination of any two or more of scandium (Sc), erbium (Er), yttrium (Y), and lanthanum (La). Also, as an example, the transition metal may include any one or any combination of any two or more of titanium (Ti), zirconium (Zr), hafnium (Hf), tantalum (Ta), and niobium (Nb). Further, the transition metal may also include magnesium (Mg), which is a divalent metal.

The crystallinity (FWHM) of the piezoelectric layer 1540 may be 2 degrees or less.

The second electrode 1550 is formed to cover at least a portion of the piezoelectric layer 1540 disposed on an upper portion of a cavity C. The second electrode 1550 may be used as either an input electrode or an output electrode for inputting or outputting, respectively, an electrical signal such as a radio frequency (RF) signal. For example, when the first electrode 1530 is used as an input electrode, the second electrode 1550 may be used as an output electrode, and when the first electrode 1530 is used as an output electrode, the second electrode 1550 may be used as an input electrode.

The second electrode 1550 may be formed of an aluminum alloy containing scandium (Sc), like the first electrode 1530.

In addition, the second electrode 1550 may include a frame portion 1552 disposed at an edge of an active region. The frame portion 1552 has a thickness greater than that of a remaining portion of the second electrode 1550. For example, the frame portion 1552 reflects a lateral wave generated during resonance to an inside of the active region to confine resonance energy in the active region.

The passivation layer 1560 is formed in a region excluding portions of the first electrode 1530 and the second electrode 1550. The passivation layer 1560 prevents damage to the second electrode 1550 and the first electrode 1530 during a manufacturing process.

The passivation layer 1560 may be adjusted in thickness in a final process to control a frequency. The passivation layer 1560 may be formed using the same material as that used for the membrane layer 1520. For example, a dielectric layer including one of manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the passivation layer 1560.

The metal pad 1570 is formed on portions of the first electrode 1530 and the second electrode 1550 in which the passivation layer 1560 is not formed. As an example, the metal pad 1570 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

Figure 25:
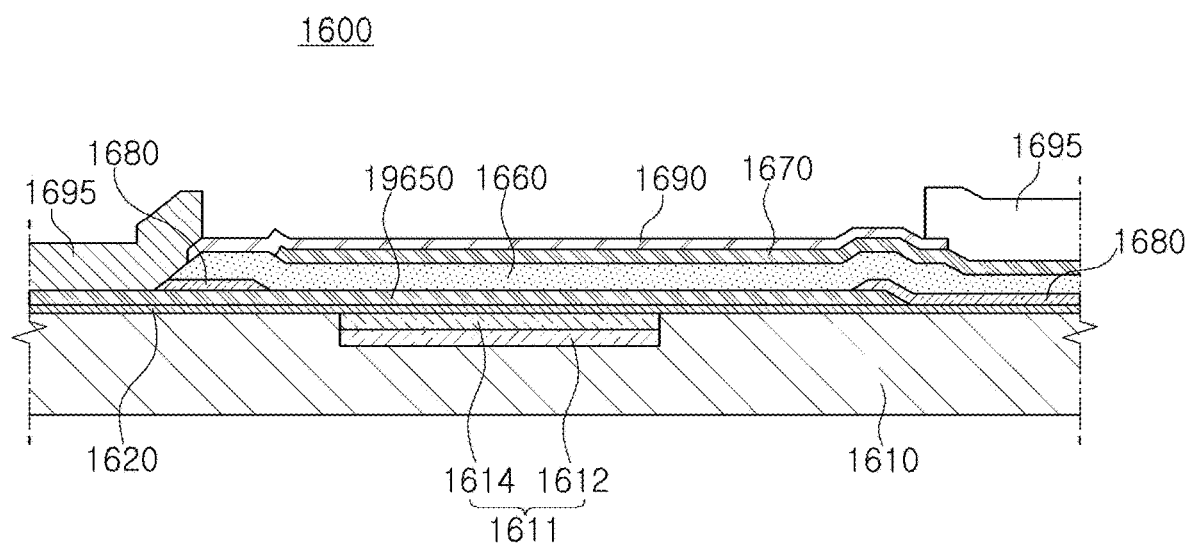
FIG. 25 is a schematic cross-sectional view illustrating a bulk acoustic wave resonator, according to another embodiment.

FIG. 25 is a schematic cross-sectional view illustrating a bulk acoustic wave resonator 1600, according to another embodiment.

Referring to FIG. 25, the bulk acoustic wave resonator 1600 may include a substrate 1610, a membrane layer 1620, a first electrode 1650, a piezoelectric layer 1660, a second electrode 1670, an insertion layer 1680, a passivation layer 1690, and a metal pad 1695.

The substrate 1610 and the membrane layer 1620 have the same respective configurations as the substrate 1510 and the membrane layer 1520 included in the bulk acoustic wave resonator 1500 of FIG. 24. Thus, a detailed description of the substrate 1610 and the membrane layer 1620 will be omitted.

In addition, the first electrode 1650, the piezoelectric layer 1660, the second electrode 1670, the insertion layer 1680, the passivation layer 1690 and the metal pad 1695 are the same components as the second electrode 150, the piezoelectric layer 160, the second electrode 170 and the insertion layer 180, the passivation layer 190 and the metal pad 195, respectively, provided in the bulk acoustic wave resonator 100 of FIGS. 1-4. Thus, a detailed description of these components will be omitted.

The insertion layer 1680 is disposed between the first electrode 1650 and the piezoelectric layer 1660. The insertion layer 1680 may be formed using a dielectric such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenic (GaAs), hafnium oxide ($HfO_2$), aluminum oxide ($Al_2O_3$), titanium oxide ($TiO_2$), zinc oxide (ZnO) or the like, and may be formed of a material different from that of the piezoelectric layer 1860. In addition, an area in which the insertion layer 1680 is provided may also be provided as air, as required, which may be implemented by removing the insertion layer 1680 during fabrication.

In this embodiment, a thickness of the insertion layer 1680 may be the same as or similar to that of the first electrode 1650. The insertion layer 1680 may also be formed to have a thickness less than or similar to that of the piezoelectric layer 1660. For example, the thickness of the insertion layer 1680 may be 100 Å or more while being less than that of the piezoelectric layer 1660, but the configuration of the insertion layer 1680 is not limited to this example.

The insertion layer 1680 is the same as the insertion layer 180 provided in the bulk acoustic wave resonator 100 of FIGS. 1-4. Thus, a detailed description of the insertion layer 1680 will be omitted.

As set forth above, according to example embodiments, crystalline properties of a piezoelectric layer may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
   a substrate;
   a first electrode disposed on the substrate and comprising:
      a first electrode layer composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or composed of an alloy including any one of Mo, Ru, W, Ir, Pt, Cu, Ti, Ta, Ni, and Cr; and
      a second electrode layer layered with the first electrode layer and composed of an aluminum alloy containing scandium (Sc), the second electrode layer having a surface roughness of 2.4 nm or less, based on an arithmetic mean roughness;
   a piezoelectric layer at least partially disposed on either one of the first electrode layer and the second electrode layer; and
   a second electrode disposed on the piezoelectric layer.

2. The bulk acoustic wave resonator of claim 1, wherein a content of the scandium (Sc) in the second electrode layer is 0.1 at % to 5 at %.

3. The bulk acoustic wave resonator of claim 1, wherein a doping material of the piezoelectric layer comprises any one or any combination of any two or more of scandium, erbium, yttrium, lanthanum, titanium, zirconium, and hafnium.

4. The bulk acoustic wave resonator of claim 3, wherein a content of the doping material in the piezoelectric layer is 0.1 at % to 30 at %.

5. The bulk acoustic wave resonator of claim 1, wherein a full width at half maximum (FWHM), representing crystallinity, of the piezoelectric layer is 1 degree or less.

6. The bulk acoustic wave resonator of claim 1, further comprising a passivation layer disposed to cover either one or both of the first electrode and the second electrode.

7. The bulk acoustic wave resonator of claim 1, wherein the second electrode comprises an aluminum alloy layer containing scandium (Sc).

8. The bulk acoustic wave resonator of claim 1, wherein the second electrode is composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or comprises a layer composed of an alloy including any one of Mo, Ru, W, Ir, Pt, Cu, Ti, Ta, Ni, and Cr.

9. The bulk acoustic wave resonator of claim 1, wherein the second electrode comprises
   a third electrode layer composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or composed of an alloy including any one of Mo, Ru, W, Ir, Pt, Cu, Ti, Ta, Ni, and Cr, and
   a fourth electrode layer disposed on the third electrode layer and including an aluminum alloy containing scandium (Sc).

10. The bulk acoustic wave resonator of claim 1, wherein the second electrode comprises a third electrode layer including an aluminum alloy containing scandium (Sc), and a fourth electrode layer disposed on the third electrode layer, the fourth electrode layer being composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or being composed of an alloy including any one of Mo, Ru, W, Ir, Pt, Cu, Ti, Ta, Ni, and Cr.

11. A bulk acoustic wave resonator, comprising:
   a substrate;
   a first electrode disposed on the substrate, and comprising:
      a first electrode layer composed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or composed of an alloy including any one of Mo, Ru, W, Ir, Pt, Cu, Ti, Ta, Ni, and Cr; and
      a second electrode layer layered with the first electrode layer and composed of an aluminum alloy containing scandium (Sc);
   a piezoelectric layer at least partially disposed on either one of the first electrode layer and the second electrode layer; and
   a second electrode disposed on the piezoelectric layer,
   wherein a full width at half maximum (FWHM), representing crystallinity, of the piezoelectric layer is 1 degree or less.

* * * * *